(12) United States Patent
Han et al.

(10) Patent No.: US 12,150,353 B2
(45) Date of Patent: Nov. 19, 2024

(54) DISPLAY SUBSTRATE AND DISPLAY APPARATUS

(71) Applicant: BOE TECHNOLOGY GROUP CO., LTD., Beijing (CN)

(72) Inventors: Long Han, Beijing (CN); Tian Dong, Beijing (CN); Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 478 days.

(21) Appl. No.: 17/630,589

(22) PCT Filed: Feb. 8, 2021

(86) PCT No.: PCT/CN2021/075966
§ 371 (c)(1),
(2) Date: Jan. 27, 2022

(87) PCT Pub. No.: WO2022/165831
PCT Pub. Date: Aug. 11, 2022

(65) Prior Publication Data
US 2023/0165076 A1 May 25, 2023

(51) Int. Cl.
*H10K 59/131* (2023.01)
*G09G 3/3233* (2016.01)
*H10K 59/126* (2023.01)

(52) U.S. Cl.
CPC ......... *H10K 59/131* (2023.02); *G09G 3/3233* (2013.01); *G09G 2300/0819* (2013.01);
(Continued)

(58) Field of Classification Search
CPC .... H10K 59/131; H10K 59/126; H10K 77/10; H10K 59/12; G09G 3/3233;
(Continued)

(56) References Cited

U.S. PATENT DOCUMENTS 7,576,556 B1   8/2009   Huang et al.
9,933,678 B1   4/2018   Chen et al.
(Continued)

FOREIGN PATENT DOCUMENTS

CN   101236344   8/2008
CN   101281337   10/2008
(Continued)

OTHER PUBLICATIONS

PCT International Search Report (with English translation) and Written Opinion for corresponding PCT Application No. PCT/CN2021/075975, 14 pages.
(Continued)

*Primary Examiner* — Bryan Earles
(74) *Attorney, Agent, or Firm* — Dority & Manning, P.A.

(57) ABSTRACT

A display substrate has sub-pixels. Each column of sub-pixels includes first and second sub-pixels alternately arranged. The display substrate includes a base, a second source-drain metal layer including first and second connection portions, and a first source-drain metal layer including first and second data lines alternately arranged. A pixel driving circuit of each first sub-pixel is connected to a second end of a first connection portion, and a first end there is connected to a corresponding first data line. A pixel driving circuit of each second sub-pixel is connected to a second end of a second connection portion, and a first end thereof is connected to a corresponding second data line. In a same column of sub-pixels, an extension direction of a first line connecting a second end of a first connection portion and a second end of a second connection portion is substantially parallel to a second direction.

18 Claims, 27 Drawing Sheets

(52) U.S. Cl.
CPC ............... *G09G 2300/0842* (2013.01); *G09G 2300/0861* (2013.01); *G09G 2310/0202* (2013.01); *G09G 2320/0233* (2013.01); *G09G 2360/16* (2013.01); *H10K 59/126* (2023.02)

(58) Field of Classification Search
CPC ... G09G 2300/0819; G09G 2300/0842; G09G 2300/0861; G09G 2310/0202; G09G 2320/0233; G09G 2360/16; G09G 2300/0426; G09G 2310/0297; G09G 3/32; G09G 3/14; G09F 9/33
See application file for complete search history.

(56) References Cited

U.S. PATENT DOCUMENTS

| | | | |
|---|---|---|---|
| 12,020,995 B2* | 6/2024 | Kim | H01L 27/1255 |
| 2002/0075249 A1 | 6/2002 | Kubota et al. | |
| 2017/0194390 A1 | 7/2017 | Kim | |
| 2018/0136528 A1 | 5/2018 | Xiao et al. | |
| 2018/0175135 A1 | 6/2018 | Lim et al. | |
| 2018/0323251 A1 | 11/2018 | Gang et al. | |
| 2018/0350680 A1* | 12/2018 | Zhang | H01L 27/1244 |
| 2019/0181155 A1 | 6/2019 | Li et al. | |
| 2019/0280076 A1 | 9/2019 | Bang et al. | |
| 2020/0119126 A1 | 4/2020 | Jo et al. | |
| 2020/0135830 A1 | 4/2020 | Seo et al. | |
| 2021/0192987 A1 | 6/2021 | Du et al. | |
| 2021/0319754 A1 | 10/2021 | Shang et al. | |
| 2021/0359058 A1* | 11/2021 | Cho | H01L 27/124 |
| 2021/0408157 A1 | 12/2021 | Cai | |
| 2022/0005411 A1 | 1/2022 | Wang et al. | |
| 2022/0122531 A1 | 4/2022 | Zheng | |

FOREIGN PATENT DOCUMENTS

| | | |
|---|---|---|
| CN | 105372823 | 3/2016 |
| CN | 108878484 | 11/2018 |
| CN | 110690265 | 1/2020 |
| CN | 111025798 | 4/2020 |
| CN | 111048573 | 4/2020 |
| CN | 111243441 | 6/2020 |
| CN | 111564120 | 8/2020 |
| CN | 112071882 | 12/2020 |
| KR | 20140080653 | 7/2014 |

OTHER PUBLICATIONS

PCT International Search Report and Written Opinion for corresponding PCT Application No. PCT/2021/075966, 9 pages.

* cited by examiner

DISPLAY SUBSTRATE AND DISPLAY APPARATUS

CROSS-REFERENCE TO RELATED APPLICATION

This application is a national phase entry under 35 USC 371 of International Patent Application No. PCT/CN2021/075966 filed on Feb. 8, 2021, which is incorporated herein by reference in its entirety.

TECHNICAL FIELD

The present disclosure relates to the field of display technologies, and in particular, to a display substrate and a display apparatus.

BACKGROUND

A refresh frequency (also referred to as a vertical refresh frequency or a vertical scan frequency) of a display apparatus refers to the number of times per second that a display screen can display new images. For example, the display screen may display 60 new images per second at a refresh frequency of 60 Hz. In a case where the refresh frequency of the display apparatus is relatively high, such as 75 Hz, 90 Hz, 120 Hz or higher, it may avoid blurring and tailing of images when the display apparatus displays high-speed moving images, thereby improving image quality and users' visual experience.

SUMMARY

In an aspect, a display substrate is provided. The display substrate has a plurality of sub-pixels arranged in an array in a first direction and a second direction. Each column of sub-pixels includes first sub-pixels and second sub-pixels. The first sub-pixels and the second sub-pixels are alternately arranged in the second direction. The display substrate includes a base, a first source-drain metal layer disposed on the base, and a second source-drain metal layer disposed between the base and the first source-drain metal layer. The first source-drain metal layer includes a plurality of first data lines and a plurality of second data lines. The first data lines and the second data lines are alternately arranged in the first direction. Every two adjacent columns of sub-pixels being provided with a first data line and a second data line therebetween. A column of sub-pixels corresponds to a first data line and a second data line that are located at two sides of the column of sub-pixels in the first direction. Each first sub-pixel in the column of sub-pixels is electrically connected to the corresponding first data line, and each second sub-pixel in the column of sub-pixels is electrically connected to the corresponding second data line. The second source-drain metal layer includes a plurality of first connection portions and a plurality of second connection portions. Each first connection portion includes a first end and a second end. A pixel driving circuit of each first sub-pixel is electrically connected to a second end of a first connection portion, and a first end of the first connection portion is electrically connected to a corresponding first data line. Each second connection portion includes a first end and a second end. A pixel driving circuit of each second sub-pixel is electrically connected to a second end of a second connection portion, and a first end of the second connection portion is electrically connected to a corresponding second data line. In a same column of sub-pixels, an extension direction of a first line connecting a second end of a first connection portion in a first sub-pixel and a second end of a second connection portion in a second sub-pixel is substantially parallel to the second direction, a first end of the first connection portion in the first sub-pixel is located at a first side of the first line, and a first end of the second connection in the second sub-pixel portion is located at a second side of the first line.

In some embodiments, the display substrate further includes an active layer disposed between the base and the second source-drain metal layer. The pixel driving circuit of each of the first sub-pixels and the second sub-pixels includes a writing transistor. The writing transistor includes an active pattern disposed in the active layer. Active patterns of writing transistors in every two adjacent sub-pixels in the first direction have a substantially same distance therebetween, and active patterns of writing transistors of every two adjacent sub-pixels in the second direction have a substantially same distance therebetween. In each first sub-pixel, the second end of the first connection portion is electrically connected to an active pattern of a corresponding writing transistor. In each second sub-pixel, the second end of the second connection portion is electrically connected to an active pattern of a corresponding writing transistor.

In some embodiments, First sub-pixels and second sub-pixels in each row are alternately arranged in the first direction. An extension direction of a second line connecting a second end of a first connection portion in a first sub-pixel and a second end of a second connection portion in a second sub-pixel is substantially parallel to the first direction, a first end of the first connection portion in the first sub-pixel is located at a side of the second line away from an active pattern of a writing transistor in the same first sub-pixel as the first connection portion in the second direction, and a first end of the second connection portion in the second sub-pixel is located at a side of the second line proximate to an active pattern of a writing transistor in the same second sub-pixel as the second connection portion in the second direction.

In some embodiments, the display substrate further includes a first insulating layer disposed between the second source-drain metal layer and the active layer. The first insulating layer is provided with a plurality of first via holes and a plurality of second via holes. In each first sub-pixel, the second end of the first connection portion is electrically connected to the active pattern of the corresponding writing transistor through a corresponding first via hole. In each second sub-pixel, the second end of the second connection portion is electrically connected to the active pattern of the corresponding writing transistor through a corresponding second via hole.

In some embodiments, the first insulating layer includes a first insulating sub-layer and a second insulating sub-layer. The second insulating sub-layer is disposed between the first insulating sub-layer and the base. The display substrate further includes a second gate metal layer disposed between the first insulating sub-layer and the second insulating sub-layer. The second gate metal layer includes a plurality of first shielding portions and a plurality of second shielding portions, and each sub-pixel is provided with a first shielding portion and a second shielding portion therein. In each first sub-pixel, an orthogonal projection of the first connection portion on the base overlaps with an orthogonal projection of the second shielding portion on the base, the orthogonal projection of the first connection portion on the base is non-overlapping with an orthogonal projection of the first shielding portion on the base, and an orthogonal projection of the second end of the first connection portion on the base is non-overlapping with the orthogonal projection of the second shielding portion on the base; in each second sub-pixel, an orthogonal projection of the second connection portion on the base overlaps with an orthogonal projection of the first shielding portion on the base, the orthogonal projection of the second connection portion on the base is non-overlapping with an orthogonal projection of the second shielding portion on the base, and an orthogonal projection of the second end of the second connection portion on the base is non-overlapping with the orthogonal projection of the first shielding portion.

In some embodiments, in a same row of sub-pixels, first shielding portions and second shielding portions are alternately arranged in the first direction, and the first shielding portion and the second shielding portion that are adjacent in the first direction and located in different sub-pixels are formed into a one-piece structure.

In some embodiments, a maximum dimension of each first connection portion in an extending direction of the first connection portion is greater than a maximum dimension of each second connection portion in an extending direction of the second connection portion.

In some embodiments, an area of the first end of each first connection portion is greater than an area of the second end thereof, and/or an area of the first end of each second connection portion is greater than an area of the second end thereof.

In some embodiments, each first data line includes a first body and a plurality of fifth connection portions. The plurality of fifth connection portions are disposed at a side of the first body proximate to first sub-pixels that are electrically connected to the first data line and arranged in the second direction. Each fifth connection portion is electrically connected between the first body and a first end of a corresponding first connection portion. Each second data line includes a second body and a plurality of sixth connection portions. The plurality of sixth connection portions are disposed at a side of the second body proximate to second sub-pixels that are electrically connected to the second data line and arranged in the second direction. Each sixth connection portion is electrically connected between the second body and a first end of a corresponding second connection portion.

In some embodiments, the display substrate further includes a second insulating layer disposed between the first source-drain metal layer and the second source-drain metal layer. The second insulating layer is provided with a plurality of third via holes and a plurality of fourth via holes. Each fifth connection portion is electrically connected to the first end of the corresponding first connection portion through a corresponding third via hole. Each sixth connection portion is electrically connected to the first end of the corresponding second connection portion through a corresponding fourth via hole.

In some embodiments, the display substrate further includes a plurality of first voltage signal lines. An orthogonal projection, on the base, of each first voltage signal line is located between orthogonal projections, on the base, of the first data line and the second data line between two adjacent columns of sub-pixels. The first voltage signal line is electrically connected to pixel driving circuits of at least one column of sub-pixels of the two adjacent columns of sub-pixels. The first voltage signal line includes a first voltage signal sub-line disposed in the first source-drain metal layer, and a second voltage signal sub-line disposed in the second source-drain metal layer. The first voltage signal sub-line is electrically connected to the second voltage signal sub-line.

In some embodiments, the display substrate further includes a second insulating layer disposed between the first source-drain metal layer and the second source-drain metal layer. The second insulating layer is provided with a plurality of fifth via holes. The first voltage signal sub-line and the second voltage signal sub-line are electrically connected through at least one fifth via hole of the plurality of fifth via holes. In a first data line, a second data line and a first voltage signal sub-line that are located between two adjacent columns of sub-pixels, a portion of the first data line adjacent to the fifth via hole is bent in a direction from the first voltage signal sub-line to the first data line to form a first bent portion, and a portion of the second data line adjacent to the fifth via hole is bent in a direction from the first voltage signal sub-line to the second data line to form a second bent portion. The first bent portion and the second bent portion are opposite to each other to form an accommodating region. The first voltage signal sub-line includes a conductive portion passing through the fifth via hole, and the conductive portion is located in the accommodating region. A dimension of the conductive portion is greater than a width of a portion of the first voltage signal sub-line except the conductive portion in the first direction.

In some embodiments, a seventh connection portion is provided between a first bent portion and a second bent portion in the first data line and the second data line that are corresponding to the column of sub-pixels and located at two sides of the column of sub-pixels in the first direction, the seventh connection portion and the first voltage signal sub-line are disposed in a same layer.

In some embodiments, the display substrate further includes an anode layer disposed at a side of the first source-drain metal layer away from the base, and an active layer disposed between the base and the second source-drain metal layer. The anode layer includes an anode pattern provided in each sub-pixel. The pixel driving circuit of each of the first sub-pixels and the second sub-pixels includes a first light-emitting control transistor. The first light-emitting control transistor includes an active pattern disposed in the active layer, and the active pattern includes a first conductive portion. The seventh connection portion is electrically connected to the first conductive portion and the anode pattern.

In some embodiments, the display substrate further includes eighth connection portions disposed in the second source-drain metal layer. Each sub-pixel being provided with an eighth connection portion therein. In a same sub-pixel, an end of the eighth connection portion is electrically connected to a first conductor portion of an active pattern, and another end of the eighth connection portion is electrically connected to a seventh connection portion.

In some embodiments, the first side of the first connecting line is a side of a first connecting line proximate to a first data line corresponding to the column of sub-pixels in the first direction. The second side of the first connecting line is a side of the first connecting line proximate to a second data line corresponding to the column of sub-pixels in the first direction.

In some embodiments, each first connection portion further includes a first transition sub-portion connected between the first end and the second end. In each first connection portion, a dimension of the first transition sub-portion in a direction perpendicular to an extending direction of the first connection portion is less than dimensions of the first end and the second end in the direction perpendicular to the extending direction of the first connection portion, And/or each second connection portion further includes a second transition sub-portion connected between the first end and the second end. In each second connection portion a dimension of the second transition sub-portion in a direction perpendicular to an extending direction of the second connection portion is less than dimensions of the first end and the second end in the direction perpendicular to the extending direction of the first connection portion.

In another aspect, a display apparatus is provided. The display apparatus includes the display substrate according to any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
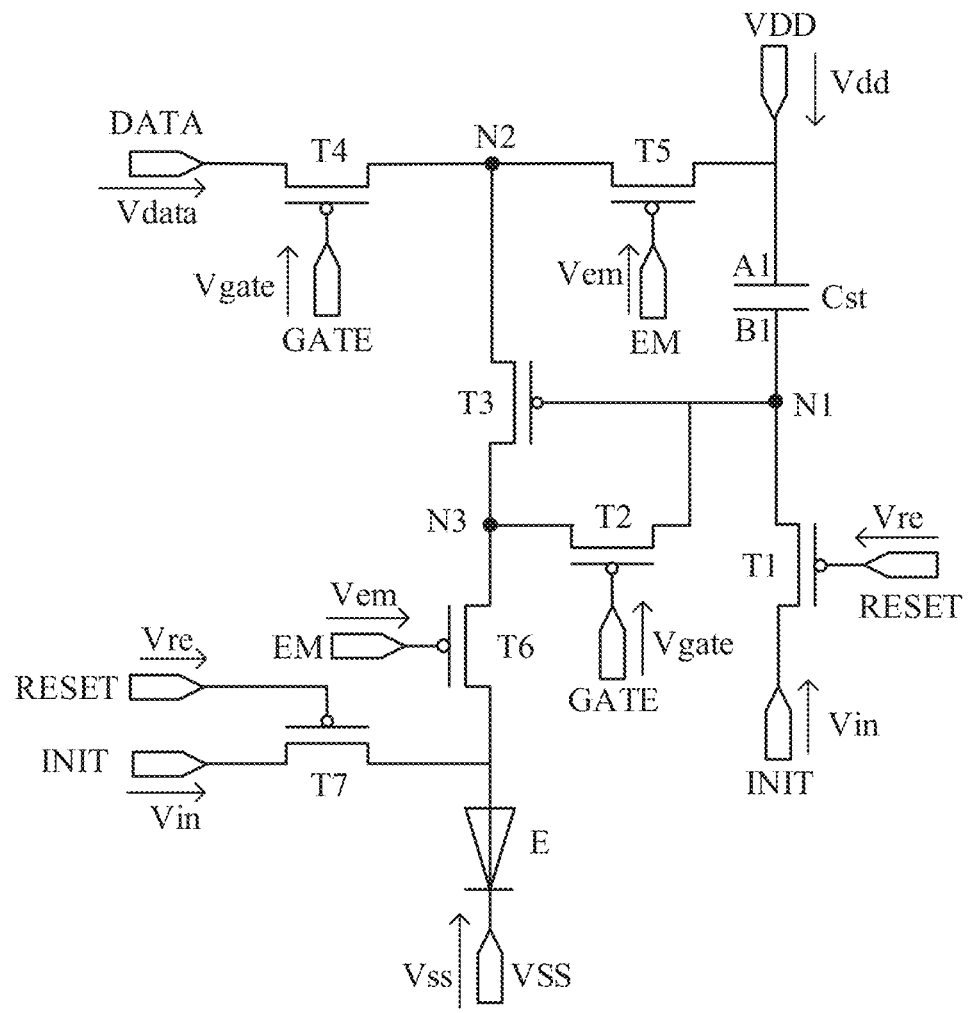
FIG. 1 is an equivalent circuit diagram of a pixel driving circuit with a 7T1C structure, in accordance with some embodiments.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its derivatives may be used. For example, the term "connected" may be used in the description of some embodiments to indicate that two or more components are in direct physical contact or electrical contact with each other, or to indicate that two or more components are indirect physical contact or electrical contact with each other. The embodiments disclosed herein are not necessarily limited to the contents herein.

In the description of the present disclosure, it can be understood that, orientations or positional relationships indicated by the terms such as "center", "upper", "lower", "front", "rear", "left", "right", "vertical", "horizontal", "top", "bottom", "inner", "outer", are based on orientations or positional relationships shown in the accompanying drawings. They are merely to facilitate and simplify the description of the present disclosure, but not to indicate or imply that the indicated apparatuses or elements must have a particular orientation, or must be constructed or operated in a particular orientation. Therefore, they should not be construed as limitations to the present disclosure.

The phrase "A and/or B" includes the following three combinations: only A, only B, and a combination of A and B.

The term "about" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

In a case where a display apparatus operates at a high refresh frequency (e.g., 75 Hz, 90 Hz, 120 Hz or higher), quality of displayed images and users' visual experience may be improved. However, the high refresh frequency will bring about a problem of shortening data writing time and compensation time of sub-pixels in the display apparatus, which may cause a charging rate of the sub-pixels to become insufficient and a threshold voltage compensation effect to be decreased, and thereby reducing a display effect of the display apparatus.

As shown in FIG. 1, in an example where a display apparatus includes pixel driving circuits with a 7T1C structure, the display apparatus includes a plurality of sub-pixels, and each sub-pixel includes a pixel driving circuit with the 7T1C structure; and the pixel driving circuit includes seven transistors (a first transistor T1 to a seventh transistor T7) and a capacitor Cst. The seven transistors may be P-type transistors, that is, the seven transistors are turned on when receiving low-level signals at respective gates and turned off when receiving high-level signals at respective gates. Alternatively, the seven transistors may be N-type transistors, that is, the seven transistors are turned on when receiving high-level signals at respective gates and turned off when receiving low-level signals at respective gates.

In order to facilitate an introduction of the pixel driving circuit with the 7T1C structure, a point where a second electrode of the first transistor T1, a second electrode plate B1 of the capacitor Cst, and a gate of a third transistor T3 are electrically connected is referred to as a first node N1, and voltages of the second electrode of the first transistor T1, the second electrode plate B1 of the capacitor Cst and the gate of the third transistor T3 are equal. A point where a second electrode of a fifth transistor T5, a second electrode of a fourth transistor T4 and a first electrode of the third transistor T3 are electrically connected is referred to as a second node N2. A point where a second electrode of the third transistor T3, a first electrode of a second transistor T2 and a first electrode of a sixth transistor T6 are electrically connected is referred to as a third node N3. It will be noted that the third transistor T3 serves as a driving transistor in the pixel driving circuit.

It will be noted that a channel width-to-length ratio of the driving transistor is generally greater than that of other transistors serving as switching transistors. That is, a channel width-to-length ratio of the third transistor T3 is generally greater than that of the first transistor T1, the second transistor T2, the fourth transistor T4, the fifth transistor T5, the sixth transistor T6, and the seventh transistor T7. In addition, an electroluminescent device is taken as an example, luminance of a light-emitting device E corresponding to each sub-pixel is related to a magnitude of a driving current I flowing therethrough. According to a formula that I is equal to $K \times (V_{gs} - V_{th})^2$ (i.e., $I = K(V_{gs} - V_{th})^2$), it can be seen that the driving current I is related to a voltage difference $V_{gs}$ between a gate and a source of the driving transistor and a threshold voltage $V_{th}$ of the driving transistor. In a case where the voltage difference $V_{gs}$ is constant, the luminance of the light-emitting device E is mainly affected by the threshold voltage $V_{th}$ of a corresponding driving transistor. As a result, in a case where the threshold voltage $V_{th}$ of the driving transistor in the sub-pixel of the display apparatus is not constant (for example, the threshold voltage $V_{th}$ of the driving transistor drifts as operating time increases), the display apparatus may have uneven display brightness.

Elements of the pixel driving circuit of 7T1C and connection relationships between the elements are introduced below. Here, for example, the transistors included in the pixel driving circuit are all P-type transistors. That is, the first transistor T1 to the seventh transistor T7 are turned on when signals received at respective gates are at low levels, and are turned off when signals received at respective gates are at high levels.

A gate of the first transistor T1 (which is also referred to as a first reset transistor) is electrically connected to a reset signal terminal RESET, a first electrode of the first transistor T1 is electrically connected to an initialization voltage signal terminal INIT, and the second electrode of the first transistor T1 is electrically connected to the first node N1. A gate of the second transistor T2 (which is also referred to as a compensation transistor) is electrically connected to a scan signal terminal GATE, the first electrode of the second transistor T2 is electrically connected to the third node N3, and a second electrode of the second transistor T2 is electrically connected to the first node N1. The gate of the third transistor T3 (which is also referred to as the driving transistor) is electrically connected to the first node N1, the first electrode of the third transistor T3 is electrically connected to the second node N2, and the second electrode of the third transistor T3 is electrically connected to the third node N3. A gate of the fourth transistor T4 (which is also referred to as a writing transistor) is electrically connected to the scan signal terminal GATE, a first electrode of the fourth transistor T4 is electrically connected to a data signal terminal DATA, and the second electrode of the fourth transistor T4 is electrically connected to the second node N2. A gate of the fifth transistor T5 (which is also referred to as a second light-emitting control transistor) is electrically connected to a light-emitting signal terminal EM, a first electrode of the fifth transistor T5 is electrically connected to a first voltage signal terminal VDD, and the second electrode of the fifth transistor T5 is electrically connected to the second node N2. A gate of the sixth transistor T6 (which is also referred to as a first light-emitting control transistor) is electrically connected to the light-emitting signal terminal EM, the first electrode of the sixth transistor T6 is electrically connected to the third node N3, and a second electrode of the sixth transistor T6 is electrically connected to an anode of the light-emitting device E of the sub-pixel. A gate of the seventh transistor T7 (which is also referred to as a second reset transistor) is electrically connected to the reset signal terminal RESET, a first electrode of the seventh transistor T7 is electrically connected to the initialization voltage signal terminal INIT, and a second electrode of the seventh transistor T7 is electrically connected to the anode of the light-emitting device E of the sub-pixel. A first electrode plate A1 of the capacitor Cst is electrically connected to the first voltage signal terminal VDD, and the second electrode plate B1 of the capacitor Cst is electrically connected to the first node N1.

The anode of the light-emitting device E of the sub-pixel is electrically connected to the pixel driving circuit, and a cathode of the light-emitting device E is electrically connected to a second voltage signal terminal VSS.

Figure 2:
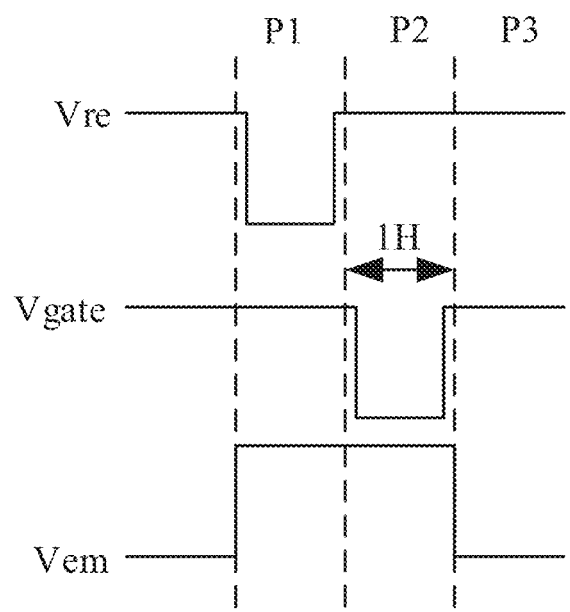
FIG. 2 is a signal timing diagram of the pixel driving circuit shown in FIG. 1.

An operation process of the pixel driving circuit of 7T1C is introduced below in conjunction with the signal timing diagram in FIG. 2. In a frame, the operation process of the pixel driving circuit includes a reset period P1, a writing and compensation period P2, and a light-emitting period P3.

In the reset period P1, a reset signal Vre transmitted from the reset signal terminal RESET to the dates of the first transistor T1 and the seventh transistor T7 is at a low level, so that the first transistor T1 and the seventh transistor T1 are turned on. The first transistor T1 transmits an initialization voltage signal Vin from the initialization voltage signal terminal INIT to the first node N1 to reset the voltages of the second electrode plate B1 of the capacitor Cst and the gate of the third transistor T3, and the voltages of the second electrode plate B1 and the gate of the third transistor T3 are equal to a voltage $V_i$ of the initialization voltage signal Vin. The seventh transistor T7 transmits the initialization voltage signal Vin from the initialization voltage signal terminal INIT to the anode of the light-emitting device E to reset a voltage of the anode of the light-emitting device E.

Here, the initialization voltage signal Vin is at a low level in the reset period P1, and the voltage of the first node N1 is a low voltage, so that the third transistor T3 whose gate is electrically connected to the first node N1 is turned on. For example, the initialization voltage signal Vin may be a constant low voltage signal.

In the writing and compensation period P2, the reset signal Vre is at a high level, so that the first transistor T1 and the seventh transistor T7 are turned off. The voltage of the first node N1 is equal to the voltage of the second electrode plate B1 of the capacitor Cst. That is, the voltage of the first node N1 is still the low voltage, and the third transistor T3 remains in a turn-on state.

A scan signal Vgate transmitted from the scan signal terminal GATE to the gates of the fourth transistor T4 and the second transistor T2 is at a low level, so that the fourth transistor T4 and the second transistor T2 are turned on. The fourth transistor T4 transmits a data signal Vdata from the data signal terminal DATA to the third transistor T3. The data signal Vdata is transmitted to the second transistor T2 through the turned-on third transistor T3, and then transmitted to the first node N1 through the turned-on second transistor T2, so as to be written into the capacitor Cst. A process in which the data signal Vdata is written into the capacitor Cst is actually a charging process of the second electrode plate B1 of the capacitor Cst (i.e., a process in which the voltage of the second electrode plate B1 gradually increases). The voltage of the first node N1 gradually increases from $V_i$ in the previous period (i.e., the reset period P1) to $(V_{data}+V_{th})$, and the third transistor T3 is turned off. Here, $V_{data}$ is a voltage of the data signal, and $V_{th}$ is the threshold voltage of the third transistor T3. In this case, the voltage of the second electrode plate B1 of the capacitor Cst is equal to $(V_{data}+V_{th})$, so that the threshold voltage $V_{th}$ of the third transistor T3 is compensated to the data signal written into the capacitor Cst.

It will be noted that, a duration 1 H of an effective level (i.e., a level at which a corresponding transistor is turned on) of the scan signal Vgate is time required for data signals Vdata to be written into sub-pixels in a row.

In the light-emitting period P3, a light-emitting signal Vem transmitted from the light-emitting signal terminal EM to the gates of the fifth transistor T5 and the sixth transistor T6 is at a low level, so that the fifth transistor T5 and the sixth transistor T6 are turned on. A source voltage $V_s$ of the third transistor T3 is equal to a first voltage $V_{dd}$ of the first voltage signal terminal VDD, and a gate voltage $V_g$ of the third transistor T3 is equal to $(V_{data}+V_{th})$. Here, the first voltage $V_{dd}$ is greater than $(V_{data}+V_{th})$, so that the third transistor T3 is turned on. In this way, a current path is formed between the first voltage signal terminal VDD and the second voltage signal terminal VSS, so that the light-emitting device E may emit light.

It will be noted that, the driving current I flowing through the light-emitting device E in the light-emitting period P3 is that $I=K\times(V_{gs}-V_{th})^2=K\times(V_{data}+V_{th}-V_{dd}-V_{th})^2=K\times(V_{data}-V_{dd})^2$. In this way, the magnitude of the driving current I is independent of the threshold voltage value $V_{th}$ of the third transistor T3, thereby avoiding an effect of a threshold voltage drift of the third transistor T3 on the driving current I, and making the brightness of the display apparatus uniform.

In a case where the display apparatus needs to be refreshed at a high frequency, since the number of new images displayed per second is large, a duration of each frame of image is shortened, and in turn, the writing and compensation period P2 in the frame is correspondingly shortened. That is, the duration of the effective level of the scan signal is shortened. This may cause data writing time (i.e., charging time) and threshold voltage compensation time of the sub-pixel of the display apparatus to be short, so that the charging rate of the sub-pixel is insufficient and the threshold voltage compensation effect is poor, thereby affecting the image quality of the display apparatus and the users' visual experience.

In order to solve the above problem, a driving manner in which two data lines DL are provided to together provide data signals Vdata to a column of sub-pixels may be adopted. Referring to FIGS. 3 to 6, a display apparatus including the pixel driving circuits with the 7T1C structure is described below by taking an example in which the driving manner is adopted.

Figure 3:
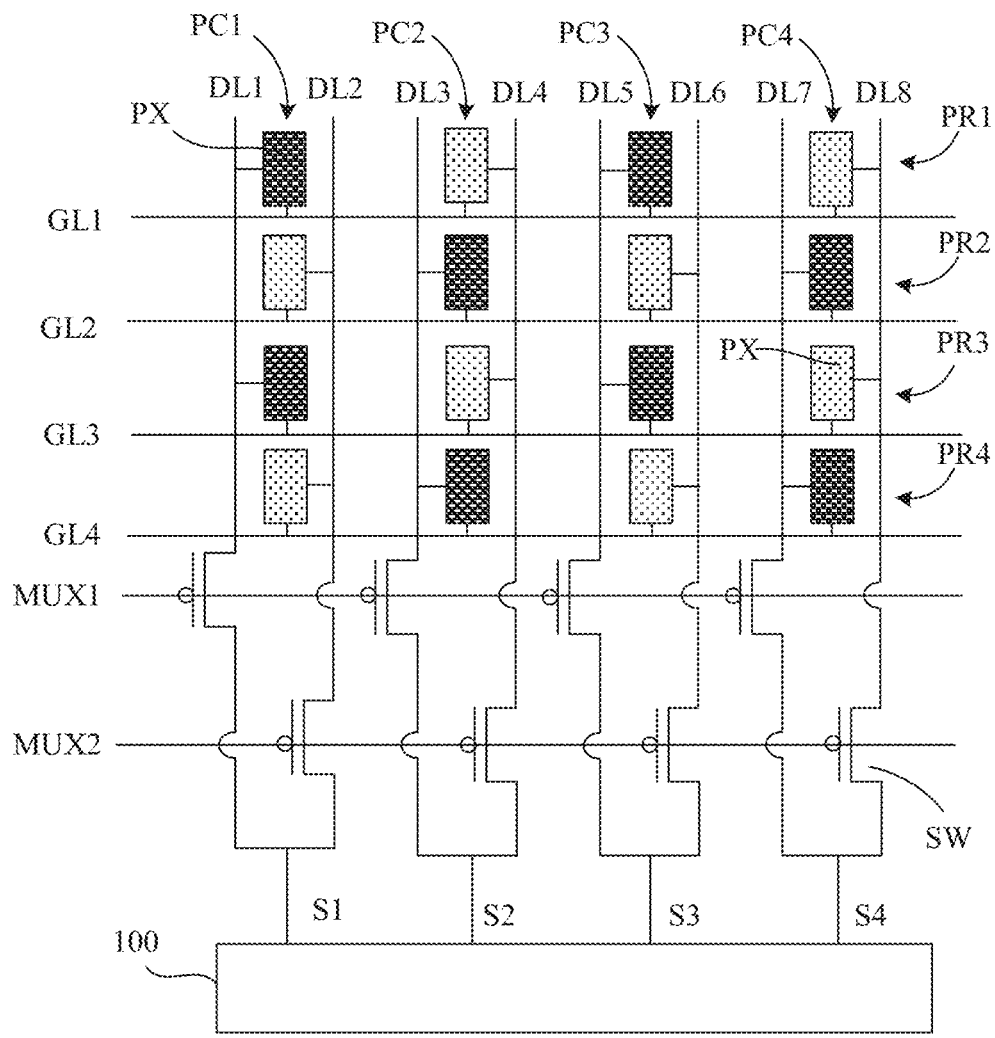
FIG. 3 is a schematic diagram showing a structure of a display apparatus, in accordance with some embodiments.
Figure 5:
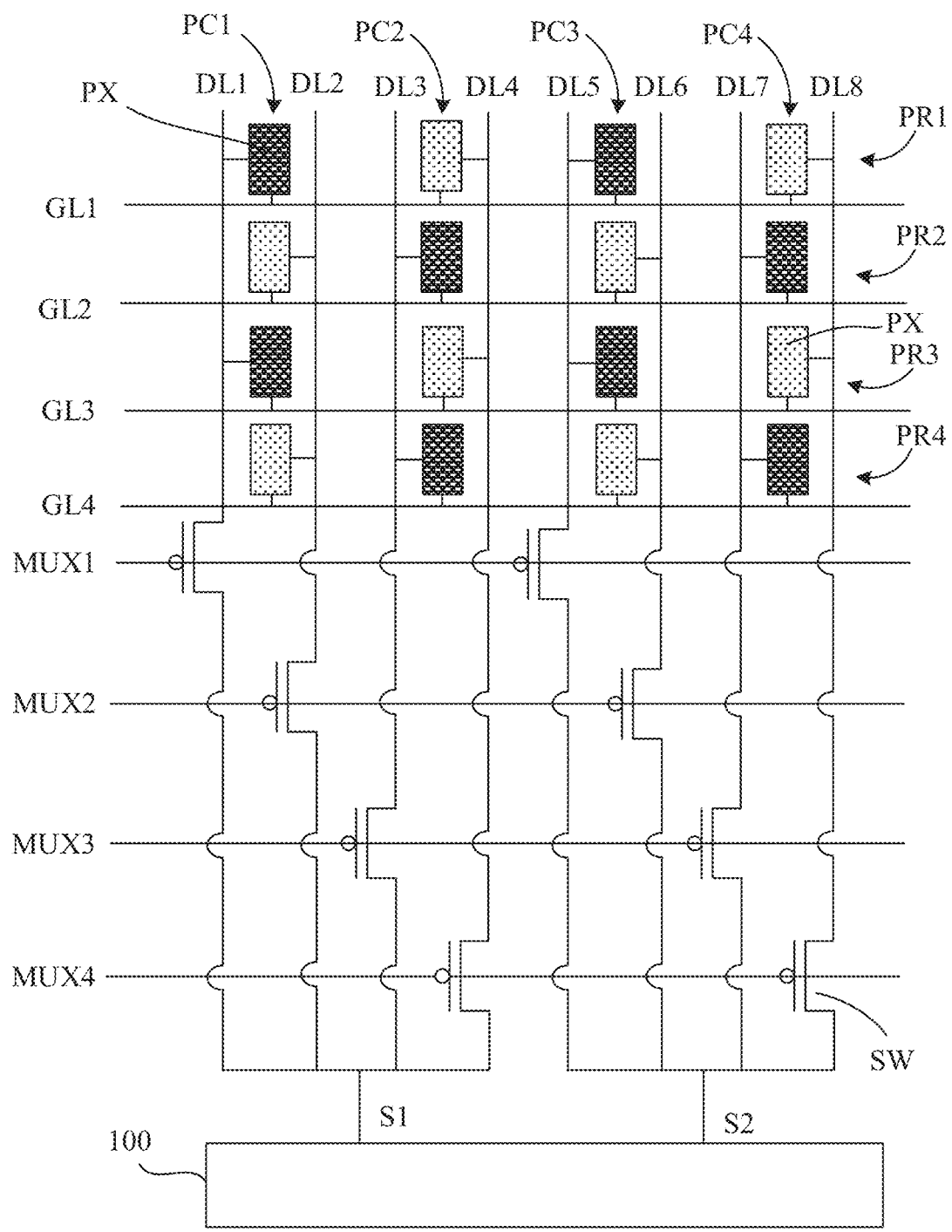
FIG. 5 is a schematic diagram showing a structure of another display apparatus, in accordance with some embodiments.

As shown in FIGS. 3 and 5, the display apparatus includes a plurality of sub-pixels PX, a plurality of data lines DL (e.g., including DL1 to DL8), and a plurality of gate lines GL (e.g., including GL1 to GL4). These sub-pixels PX may be arranged in an array. Each column of sub-pixels corresponds to two data lines DL, and the two data lines DL are disposed at a left side and a right side of the column of sub-pixels. In sub-pixels located in the same column, every two adjacent sub-pixels PX are electrically connected to different data lines DL at the left side and the right side. That is, in an extending direction of the column of sub-pixels, the sub-pixels PX located in the same column are electrically connected to the two data lines DL at the left side and the right side thereof alternately. Sub-pixels located in the same row may be electrically connected to the same gate line GL. Here, the gate line GL may provide the scan signal Vgate to a row of sub-pixels electrically connected thereto, so that the data signal Vdata from the data line DL is transmitted into a corresponding sub-pixel PX to achieve the writing of the data signal Vdata. For a data writing process of each sub-pixel PX, reference may be made to the above description of the writing and compensation period P2, which will not be repeated here.

It will be noted that, in an extending direction of each row of sub-pixels, the sub-pixels PX in the same row may be electrically connected to data lines DL at the left side and the right side of the respective sub-pixels alternately (as shown in FIGS. 3 and 5), or may be all electrically connected to data lines DL at the left side or the right side of the respective sub-pixels.

As shown in FIGS. 3 and 5, the display apparatus may further include a plurality of source driving signal lines S (e.g., including S1 to S4) and source driver(s) 100. The plurality of source driving signal lines S are electrically connected to the source driver(s) 100. The source driver 100(s) are used to provide data signals Vdata of an image to be displayed by the display apparatus. These data signals Vdata may be provided to the sub-pixels PX through the source driving signal lines S and the data lines DL.

Each adjacent data lines DL are electrically connected to the same source driving signal line S. In this way, the source driver 100 may transmit data signals Vdata to the data lines DL electrically connected to the source driving signal line S through the source driving signal line S. As a result, the number of interfaces disposed in the source driver 100 for outputting the data signals Vdata of an image to be displayed may be reduced. There is a switch SW between each data line DL and a source driving signal line S corresponding to the data line DL. In this way, the source driving signal line S may be time-division multiplexed by controlling turn-on or turn-off of respective switches SW corresponding to the source driving signal line S. Here, control electrodes of the switches SW electrically connected to data lines DL that corresponds to the same source driving signal line S and are located at the same sides of columns of sub-pixels are all electrically connected to the same control signal line MUX (e.g., MUX1 or MUX2 in FIG. 3). The switches SW electrically connected to the data lines DL may be controlled to be turned on or turned off by the control signal line MUX, thereby controlling the data signal Vdata from the source driving signal line S to be transmitted to a specific data line DL in a certain frame. In this way, the data signal Vdata may be controlled to be written into a corresponding sub-pixel PX.

Here, the switch SW may include an N-type or a P-type transistor. In a case where the switch SW is the N-type transistor, the switch SW is turned on when a signal from the control signal line MUX is at a high level, and is turned off when the signal is at a low level. In a case where the switch SW is the P-type transistor, the switch SW is turned on when the signal from the control signal line MUX is at a low level, and is turned off when the signal is at a high level.

Hereinafter, the driving processes of the display apparatuses are described by taking the structures of the display apparatuses shown in FIGS. 3 and 5 as examples. The pixel driving circuit of the sub-pixel in the display apparatus may be referred to FIG. 1. Here, for example, the second transistor T2 and the fourth transistor T4 that are in the pixel driving circuit and the switches SW are P-type transistors, and the sub-pixels PX located in the same row are electrically connected to the data lines DL at the left side or the right side of the respective sub-pixels alternately in the extending direction of the row of sub-pixels.

In some examples, referring to FIG. 3, every two adjacent data lines DL are electrically connected to the same source driving signal line S. For example, a source driving signal line S1 is electrically connected to a data line DL1 and a data line DL2. That is, the source driver 100 may provide data signals Vdata to sub-pixels in a first column PC1 through the source driving signal line S1, the data line DL1, and the data line DL2. Similarly, a source driving signal line S2 is electrically connected to a data line DL3 and a data line DL4, and the source driver 100 may provide data signals Vdata to sub-pixels in a second column PC2 through the source driving signal line S2, the data line DL3 and the data line DL4; a source driving signal line S3 is electrically connected to a data line DL5 and a data line DL6, and the source driver 100 may provide data signals Vdata to sub-pixels in a third column PC3 through the source driving signal line S3, the data line DL5 and the data line DL6; a source driving signal line S4 is electrically connected to a data line DL7 and a data line DL8, and the source driver 100 may provide data signals Vdata to sub-pixels in a fourth column PC4 through the source driving signal line S4, the data line DL7, and the data line DL8.

Two data lines DL corresponds to the same source driving signal line S. Gates of thin film transistors in switches SW each electrically connected to a data line DL located at the left side of a corresponding column of sub-pixels are all electrically connected to a control signal line MUX1, and gates of thin film transistors in switches SW each electrically connected to another data line DL located at the right side of a corresponding column of sub-pixels are all electrically connected to a control signal line MUX2. For example, gates of thin film transistors in switches SW electrically connected to the data lines DL1, DL3, DL5, and DL7 are all electrically connected to the control signal line MUX1, and gates of thin film transistors in switches SW electrically connected to the data lines DL2, DL4, DL6, and DL8 are all electrically connected to the control signal line MUX2.

Therefore, by transmitting signals at different levels to thin film transistors in different switches SW, different data lines DL may be gated to transmit the data signals Vdata to respective sub-pixels PX. In this way, the source driver 100 may transmit data signals Vdata to two data lines DL electrically connected to a source driving signal line S through the source driving signal line S.

Figure 4:
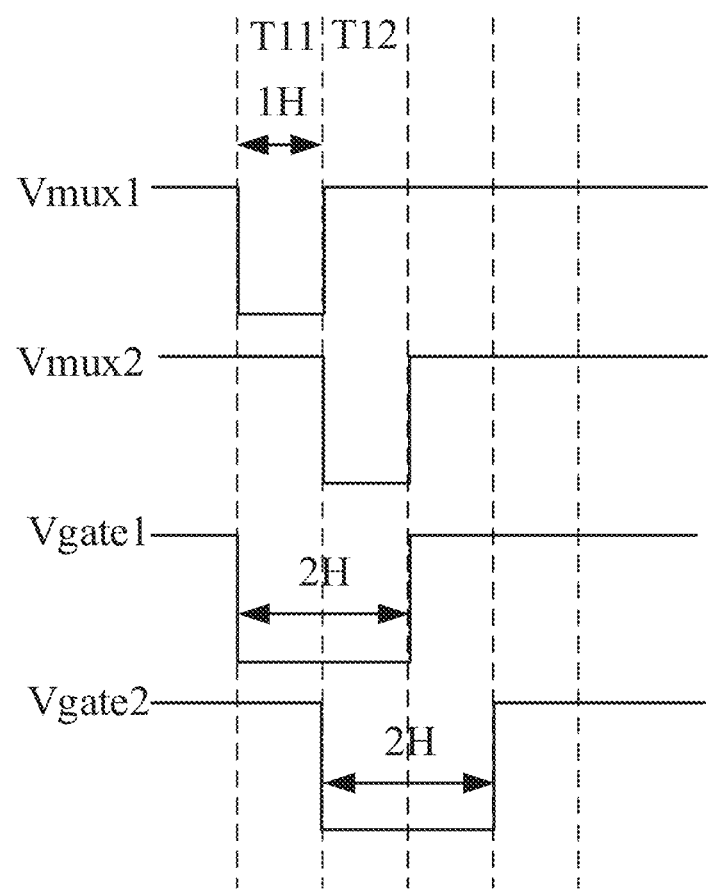
FIG. 4 is a signal timing diagram of the display apparatus shown in FIG. 3.

In this case, referring to FIG. 4, in a first phase T11, a control signal Vmux1 transmitted through the control signal line MUX1 is at a low level, so that the thin film transistors in the switches SW electrically connected to the control signal line MUX1 are turned on; a control signal Vmux2 transmitted through the control signal line MUX2 is at a high level, so that the thin film transistors in the switches SW electrically connected to the control signal line MUX2 are turned off. A scan signal Vgate1 transmitted through a gate line GL1 is at a low level, so that second transistors T2 and fourth transistors T4 in sub-pixels PX located in a first row PR1 are turned on; a scan signal Vgate2 transmitted through a gate line GL2 is at a high level, so that second transistors T2 and fourth transistors T4 in sub-pixels PX located in a second row PR2 are turned off. In this way, a data signal Vdata transmitted through the source driving signal line S1 is written into a sub-pixel located in the first row PR1 and the first column PC1, and a data signal Vdata transmitted through the source driving signal line S3 is written into a sub-pixel located in the first row PR1 and the third column PC3.

In a second phase T12, the control signal Vmux1 transmitted through the control signal line MUX1 is at a high level, so that the thin film transistors in the switches SW electrically connected to the control signal line MUX1 are turned off; the control signal Vmux2 transmitted through the control signal line MUX2 is at a low level, so that the thin film transistors in the switches SW electrically connected to the control signal line MUX2 are turned on. The scan signal Vgate1 transmitted through the gate line GL1 and the scan signal Vgate2 transmitted through the gate line GL2 are both at low levels, and the second transistors T2 and the fourth transistors T4 of the sub-pixels PX located in the first row PR1 and the second row PR2 are all turned on. In this way, the fourth transistors T4 of the sub-pixels in the first row PR1 and the second row PR2 are turned on, but the thin film transistors in the switches SW electrically connected the data lines DL1, DL3, DL5, and DL7 are all turned off. Therefore, a data signal Vdata transmitted through the source driving signal line S1 is written into a sub-pixel located in the second row PR2 and the first column PC1 through the data line DL2, a data signal Vdata transmitted through the source driving signal line S2 is written into a sub-pixel located in the first row PR1 and the second column PC2 through the data line DL4, a data signal Vdata transmitted through the source driving signal line S3 is written into a sub-pixel located in the second row PR2 and the third column PC3 through the data line CRL6, and a data signal Vdata transmitted through the source driving signal line S4 is written into a sub-pixel located in the first row PR1 and the fourth column PC4 through the data line DL8.

It will be noted that, in the above driving manner, a duration of an effective level of the scan signal Vgate of each sub-pixel PX is 2 H. That is, the duration of the effective level of the scan signal Vgate of each sub-pixel PX is equal to time required for data signals Vdata to be written into sub-pixels in two rows. In this way, time of the writing and compensation period P2 may be increased, so as to make charging time of the sub-pixel PX sufficient and improve the threshold voltage compensation effect. Therefore, the display effect of the display apparatus at a high refresh frequency may be improved.

In some embodiments, referring to FIG. 5, every four adjacent data lines DL are electrically connected to the same source driving signal line S. For example, the source driving signal line S1 is electrically connected to the data lines DL1 to DL4, and the source driving line S2 is electrically connected to the data lines DL5 to DL8.

In every four data lines DL corresponds to the same source driving signal line S, from left to right in the extending direction of the row of sub-pixels, a gate of a thin film transistor in a switch SW electrically connected to a data line DL with a sequence number one is electrically connected to the control signal line MUX1, a gate of a thin film transistor in a switch SW electrically connected to a data line DL with a sequence number two is electrically connected to the control signal line MUX2, a gate of a thin film transistor in a switch SW electrically connected to a data line DL with a sequence number three is electrically connected to a control signal line MUX3, and a gate of a thin film transistor in a switch SW electrically connected to a data line DL with a sequence number four are all electrically connected to a control signal line MUX4. For example, a gate of a thin film transistor in a switch SW electrically connected to the data line DL1 and a gate of a thin film transistor in a switch SW electrically connected to the data line DL5 are electrically connected to the control signal line MUX1, a gate of a thin film transistor in a switch SW electrically connected to the data line DL2 and a gate of a thin film transistor in a switch SW electrically connected to the data line DL6 are electrically connected to the control signal line MUX2; a gate of a thin film transistor in a switch SW electrically connected to the data line DL3 and a gate of a thin film transistor in a switch SW electrically connected to the data line DL7 are electrically connected to the control signal line MUX3; and a gate of a thin film transistor in a switch SW electrically connected to the data line DL4 and a gate of a thin film transistor in a switch SW electrically connected to the data line DL8 are electrically connected to the control signal line MUX4.

Similarly, by transmitting signals at different levels to thin film transistors in different switches SW, different data lines DL may be gated to transmit data signals Vdata to respective sub-pixels PX. In this way, by means of a manner of time-division multiplexing the source driving signal line S, the source driver 100 may transmit data signals Vdata to the four data lines DL electrically connected to the same source driving signal line S through the source driving signal line S, so as to achieve the writing of the data signals Vdata for the corresponding two columns of sub-pixels.

Figure 6:
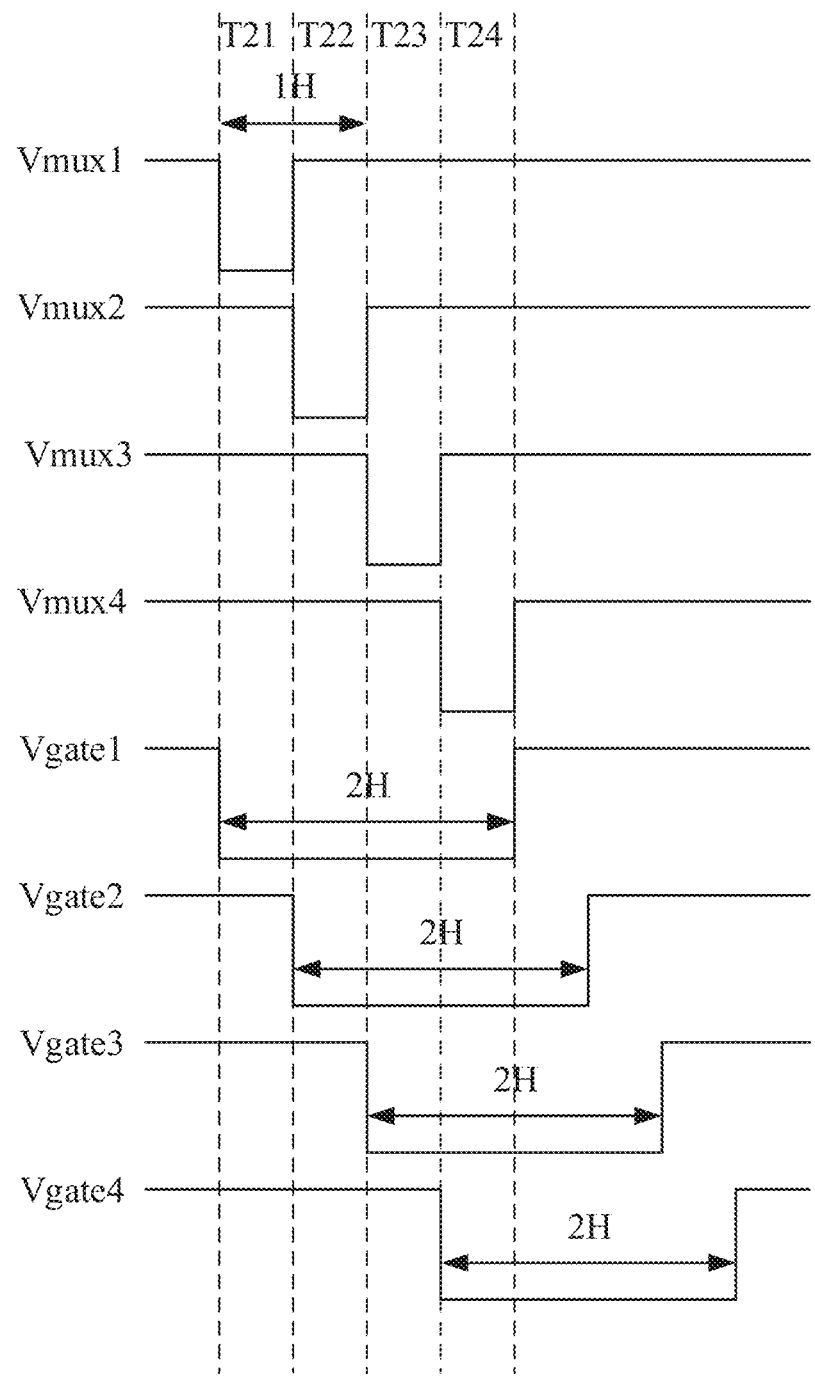
FIG. 6 is a signal timing diagram of the display apparatus shown in FIG. 5.

In this case, referring to FIG. 6, in a first phase T21, a control signal Vmux1 transmitted through the control signal line MUX1 is at a low level, so that thin film transistors in switches SW electrically connected to the control signal line MUX1 are turned on; control signals Vumx2 to Vumx4 transmitted through the control signal lines MUX2 to MUX4 are all at high levels, and thin film transistors in switches SW electrically connected to the control signal lines MUX2 to MUX4 are all turned off. A scan signal Vgate1 transmitted through the gate line GL1 is at a low level, so that the second transistors T2 and the fourth transistors T4 in the sub-pixels PX located in the first row PR1 are turned on; and scan signals Vgate2 to Vgate4 transmitted through the gate lines GL2 to GL4 are all at high levels, so that the second transistors T2 and the fourth transistors T4 in the sub-pixels PX located in the second row PR2 to a fourth row PR4 are turned off. In this way, a data signal Vdata transmitted through the source driving signal line S1 is written into the sub-pixel located in the first row PR1 and the first column PC1, and a data signal Vdata transmitted through the source driving signal line S2 is written into the sub-pixel located in the first row PR1 and the third column PC3.

In a second phase T22, the control signal Vmux2 transmitted through the control signal line MUX2 is at a low level, so that thin film transistors in switches SW electrically connected to the control signal line MUX2 are turned on; and the control signal Vmux1, the control signal Vmux3 and the control signal Vmux4 transmitted through the control signal line MUX1, the control signal line MUX3 and the control signal line MUX4 are all at high levels, so that thin film transistors in switches SW electrically connected to the control signal line MUX1, the control signal line MUX3 and the control signal line MUX4 are all turned off. The scan signals Vgate1 and Vgate2 transmitted through the gate lines GL1 and GL2 are both at low levels, so that the second transistors T2 and the fourth transistors T4 in the sub-pixels PX located in the first row PR1 and the second row PR2 are turned on; and the scan signals Vgate3 and Vgate4 transmitted through scan signal lines GL3 and GL4 are both at high levels, so that the second transistors T2 and the fourth transistors T4 in the sub-pixels PX located in a third row PR3 and the fourth row PR4 are turned off. In this way, a data signal Vdata transmitted through the source driving signal line S1 is written into the sub-pixel located in the second row PR2 and the first column PC1, and a data signal Vdata transmitted through the source driving signal line S2 is written into the sub-pixel located in the second row PR2 and the third column PC3.

In a third phase T23, the control signal Vmux3 transmitted through the control signal line MUX3 is at a low level, so that thin film transistors in switches SW electrically connected to the control signal line MUX3 are turned on; and the control signals Vmux1, Vmux2, and Vmux4 transmitted through the control signal lines MUX1, MUX2, and MUX4 are all at high levels, so that thin film transistors in switches SW electrically connected to the control signal lines MUX1, MUX2, and MUX4 are all turned off. The scan signals Vgate1 to Vgate3 transmitted through the gate lines GL1 to GL3 are all at low levels, so that the second transistors T2 and the fourth transistors T4 in the sub-pixels PX located in the first row PR1 to the third row PR3 are turned on; and the scan signal Vgate4 transmitted through the gate line GL4 is at a high level, so that the second transistors T2 and the fourth transistors T4 in the sub-pixels PX located in the fourth row PR4 are turned off. In this way, a data signal Vdata transmitted through the source driving signal line S1 is written into a sub-pixel located in the second row PR2 and the second column PC2, and a data signal Vdata transmitted through the source driving signal line S2 is written into a sub-pixel located in the second row PR2 and the fourth column PC4.

In a fourth phase T24, the control signal Vmux4 transmitted through the control signal line MUX4 is at a low level, so that thin film transistors in switches SW electrically connected to the control signal line MUX4 are turned on;

and the control signals Vmux1 to Vmux3 transmitted through the control signal lines MUX1 to MUX3 are all at high levels, so that thin film transistors in switches SW electrically connected to the control signal lines MUX1 to MUX3 are all turned off. The scan signals Vgate1 to Vgate4 transmitted through the gate lines GL1 to GL4 are all at low levels, so that the second transistors T2 and the fourth transistors T4 in sub-pixels PX located in the first row PR1 to the fourth row PR4 are all turned on. In this way, a data signal Vdata transmitted through the source driving signal line S1 is written into the sub-pixel located in the first row PR1 and the second column PC2, and a sub-pixel located in the third row PR3 and the second column PC2. A data signal Vdata transmitted through the source driving signal line S2 is written into the sub-pixel located in the first row PR1 and the fourth column PC4, and a sub-pixel located in the third row PR3 and the fourth column PC4.

Here, the duration of the effective level of the scan signal Vgate of each sub-pixel PX is 2 H, so that the time of the writing and compensation period P2 may be increased to make the charging time of the sub-pixel PX sufficient and improve the threshold voltage compensation effect. As a result, the display effect of the display apparatus at a high refresh frequency may be improved.

It will be noted that, in the fourth phase T24, the data signals Vdata written into the sub-pixel located in the third row PR3 and the second column PC2 and the sub-pixel located in the third row PR3 and the fourth column PC4 are not data signals actually required in the light-emitting periods of the sub-pixels. In a case where the duration of the effective level of the scan signal is 2 H, before the effective level of the scan signal Vgate3 is over, new data signals Vdata will be written into the two sub-pixels again, and the newly written data signals Vdata are the data signals required in the light-emitting periods of the two sub-pixels.

In some embodiments of the present disclosure, a display substrate is provided. Referring to FIG. 7 and FIGS. 9A to 10B, the display substrate 1000 includes a base 10 and a plurality of sub-pixels arranged in an array and disposed on the base 10. Here, for convenience of description, a direction perpendicular to or substantially perpendicular to an extending direction of a column of sub-pixels is defined as a first direction OU. That is, the first direction OU is a row direction in which the plurality of sub-pixels are arranged in columns. A direction parallel to or substantially parallel to the extending direction of the column of sub-pixels is defined as a second direction OV. That is, the second direction OV is a column direction in which the plurality of sub-pixels are arranged in rows. Each column of sub-pixels includes a plurality of first sub-pixels 31 and second sub-pixels 32, and the first sub-pixels 31 and the second sub-pixels 32 are alternately arranged in the second direction OV.

Figure 7:
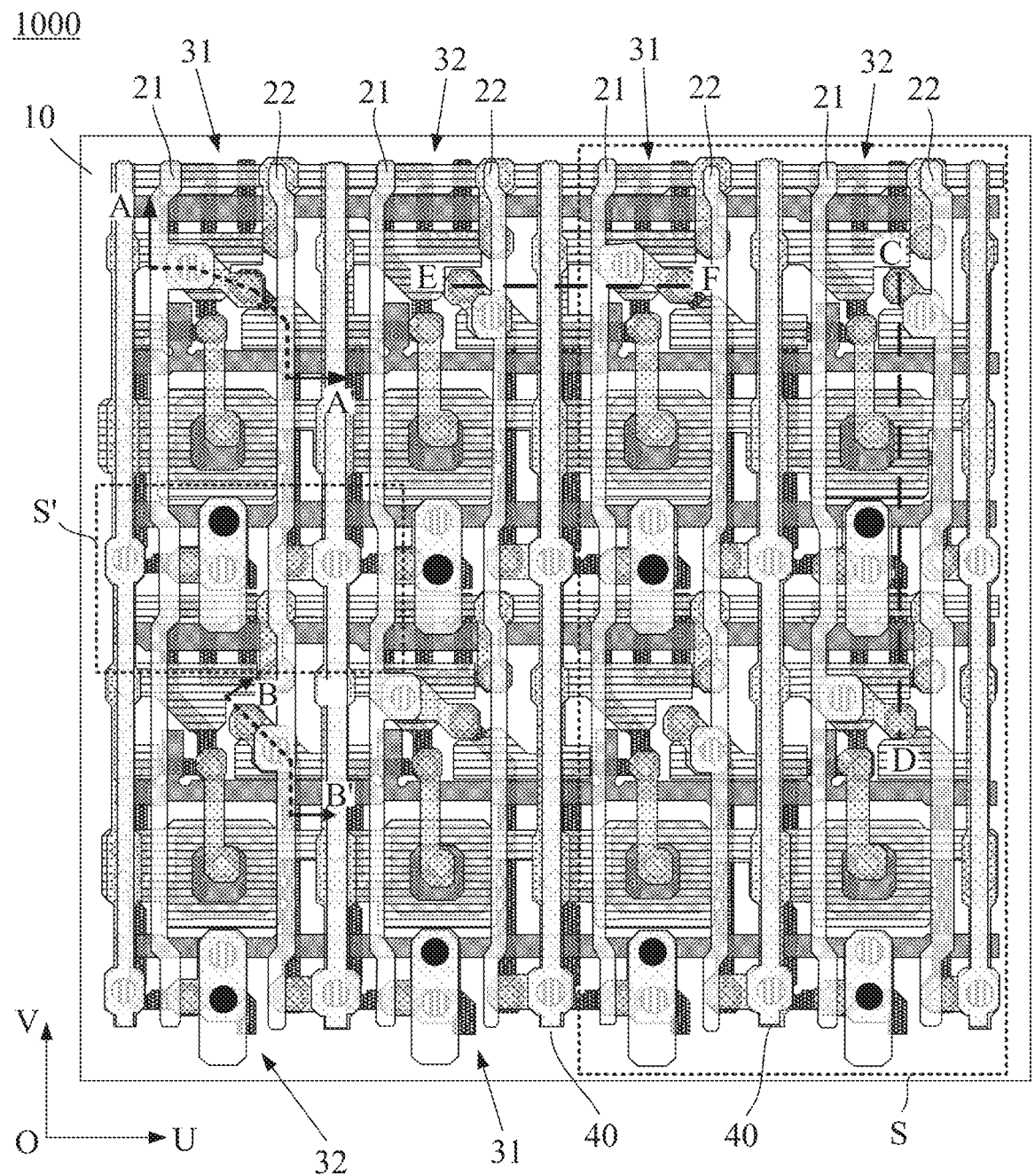
FIG. 7 is a schematic top view of a display substrate, in accordance with some embodiments.
Figure 11:
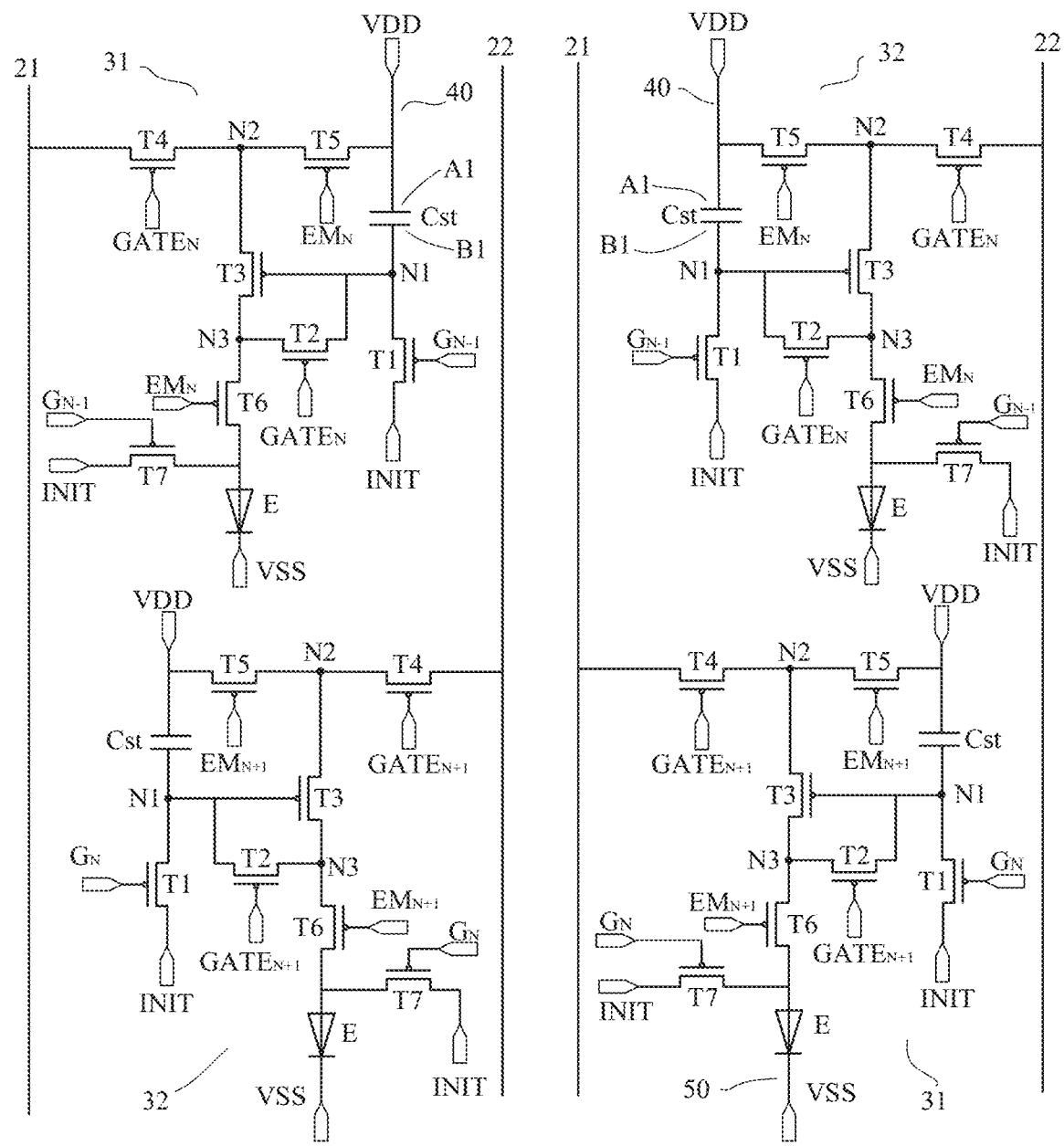
FIG. 11 is an equivalent circuit diagram of a portion of the display substrate in the region S shown in FIG. 7.

FIG. 11 is an equivalent circuit diagram of a portion of the display substrate 1000 in the region S shown in FIG. 7. Here, the description is made by taking an example in which the display substrate 1000 includes two first sub-pixels 31 and two second sub-pixels 32 that are arranged in a matrix in the region S. Each first sub-pixel 31 and each second sub-pixel 32 has a pixel driving circuit with the 7T1C structure, and the pixel driving circuit includes the first transistor T1 to the seventh transistor T7 and the capacitor Cst. Electrical connection relationships between the elements in the pixel driving circuit and an operation process of the driving circuit may be referred to the above description, which will not be repeated here.

Figure 8A:
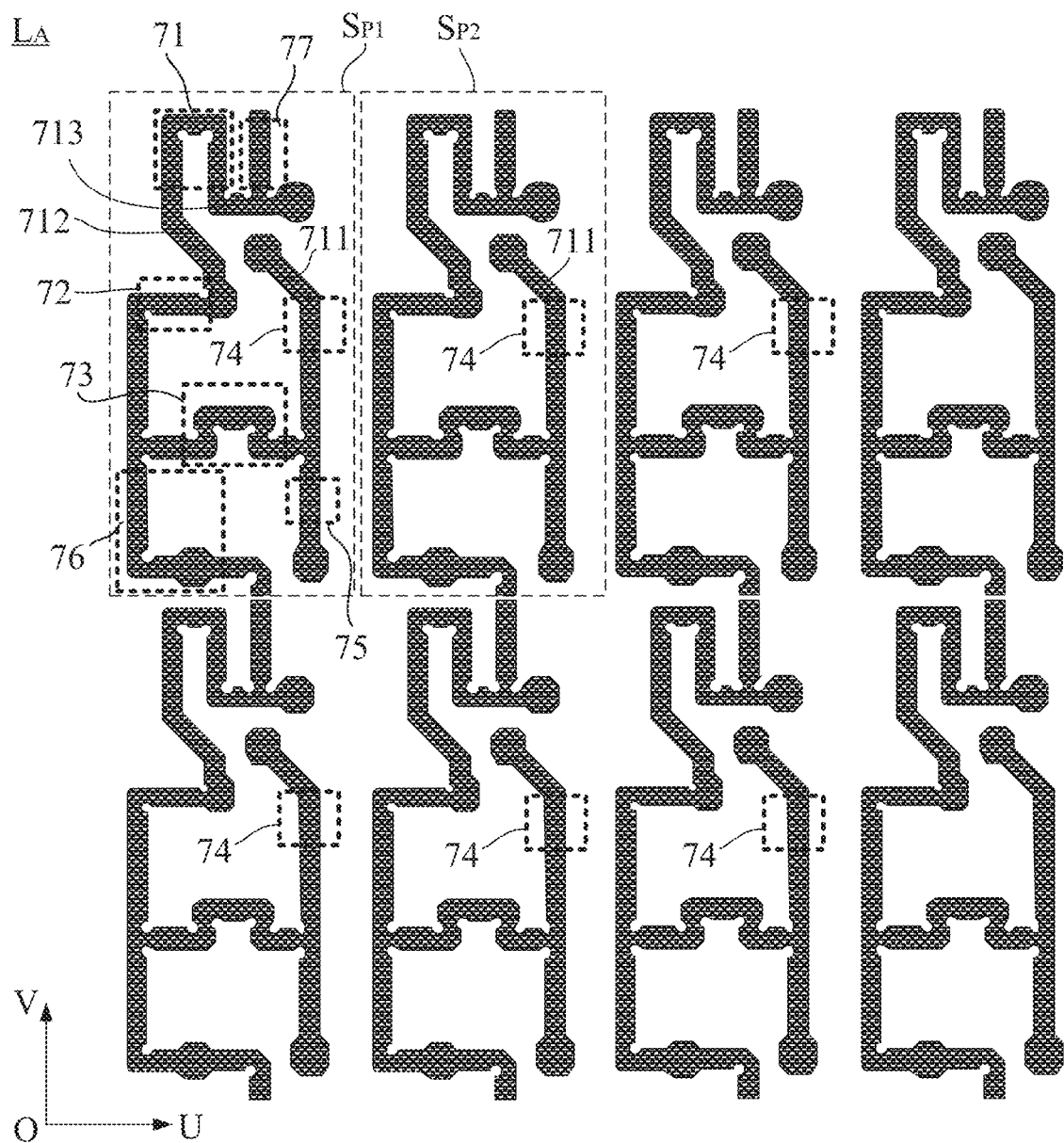
FIGS. 8A to 8H are schematic top views of film layers of the display substrate shown in FIG. 7.
Figure 8B:
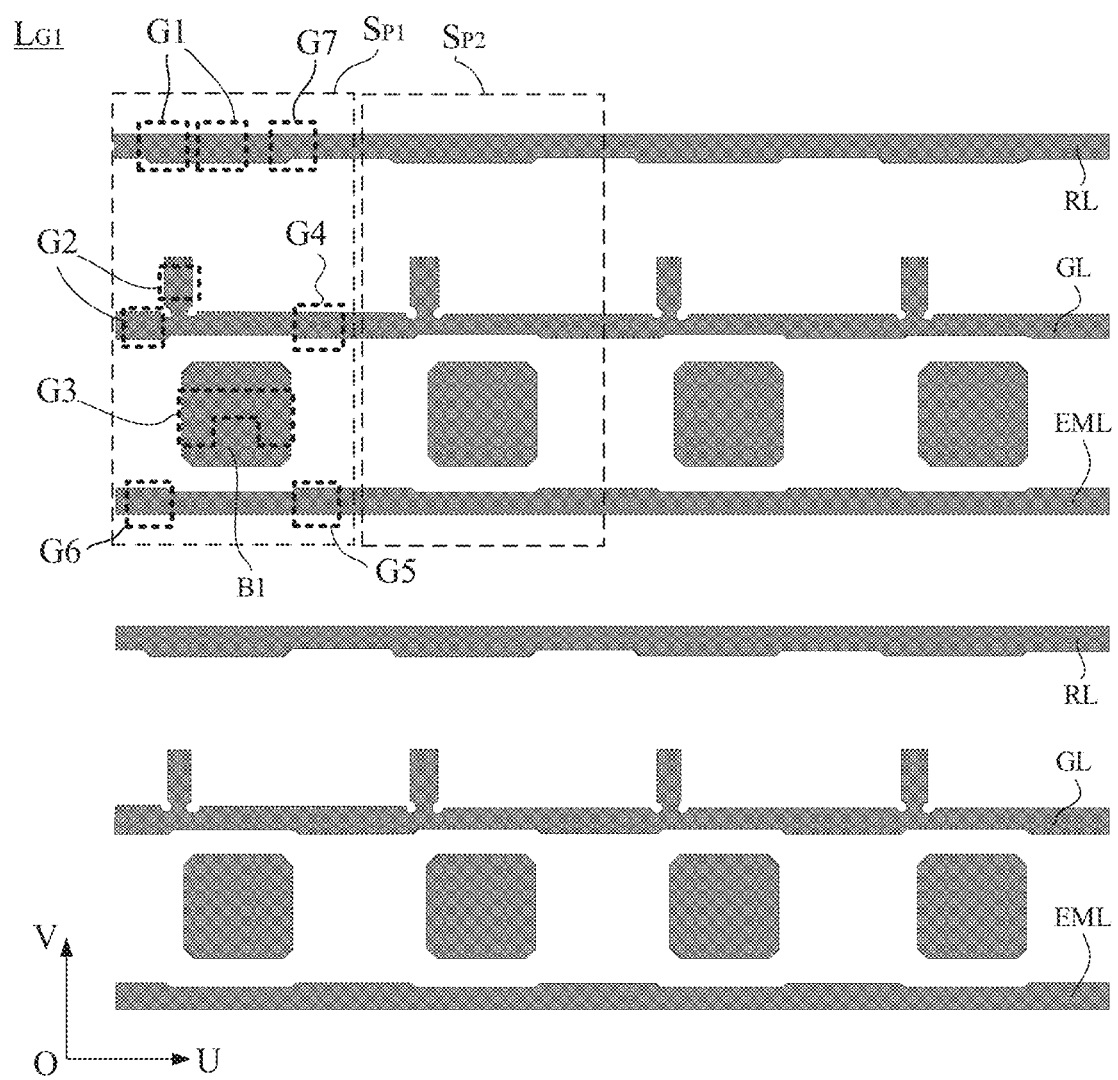
Figure 8C:
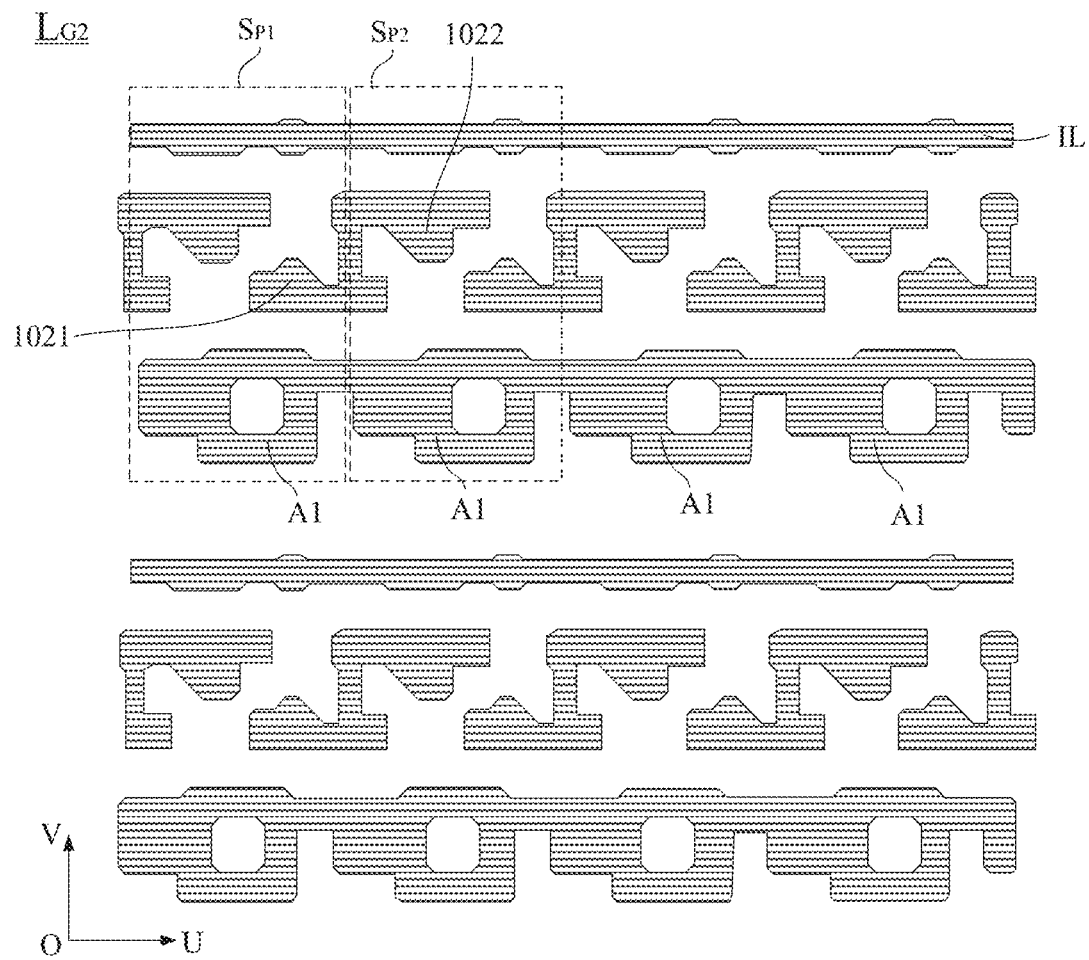
Figure 8D:
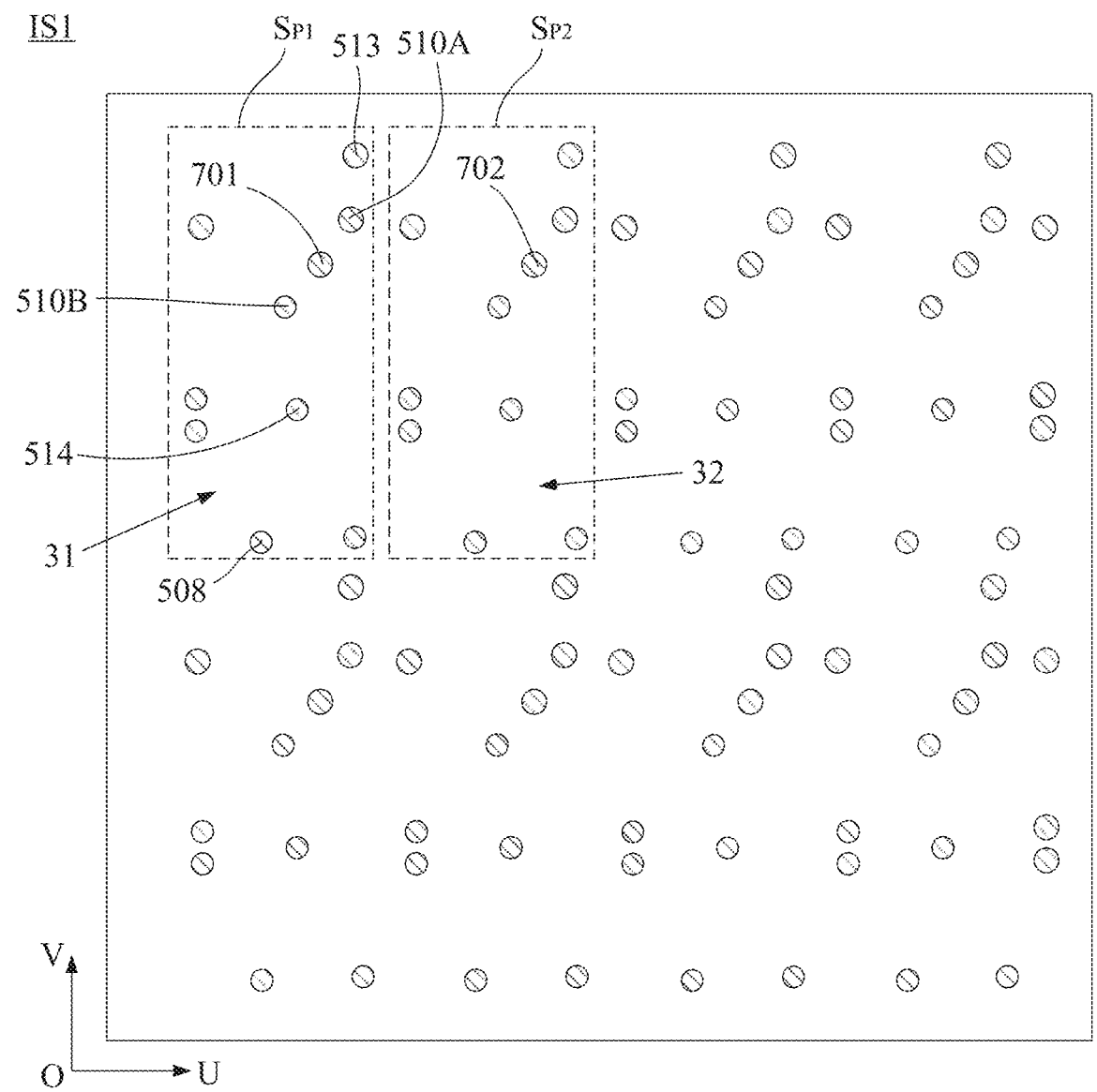
Figure 8E:
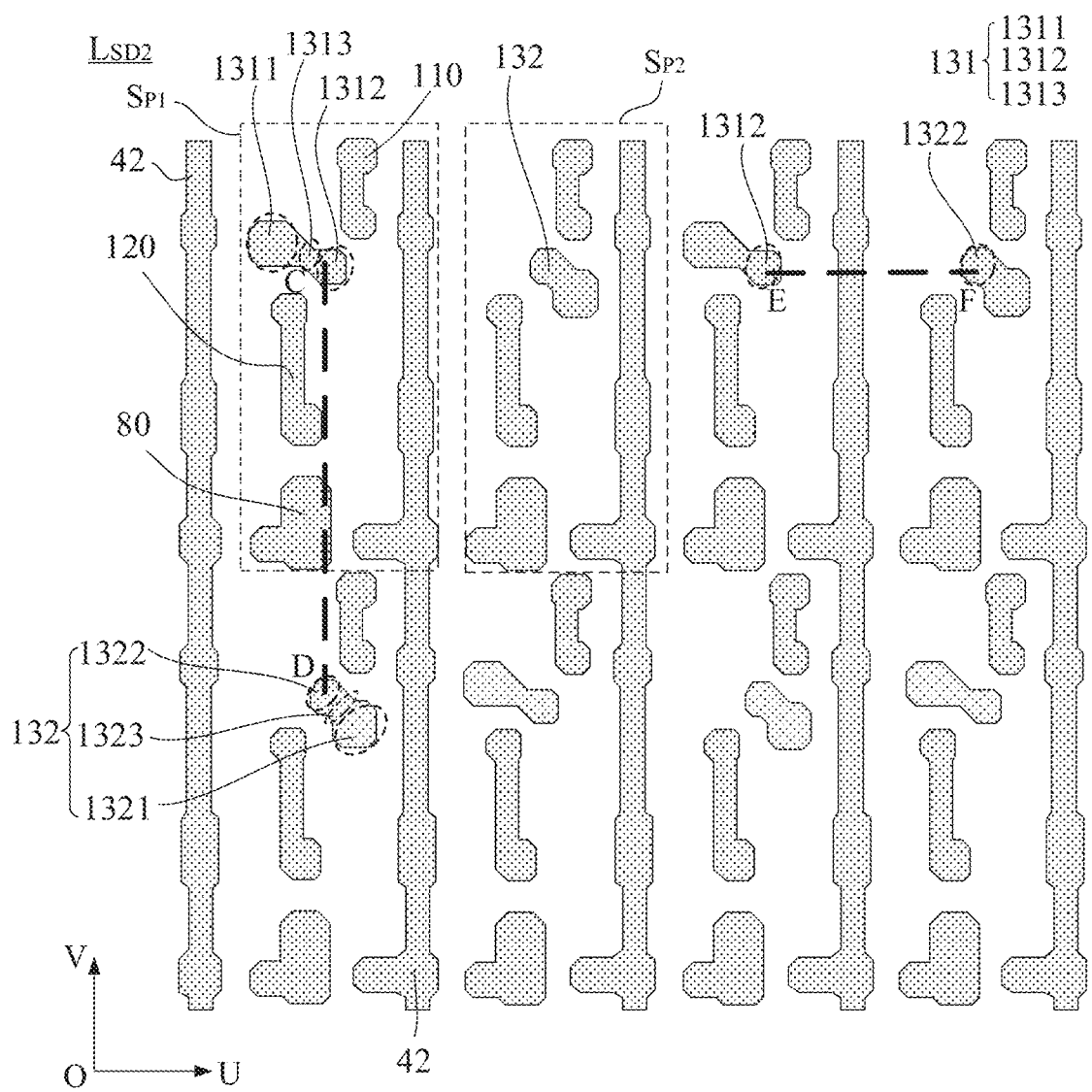
Figure 8F:
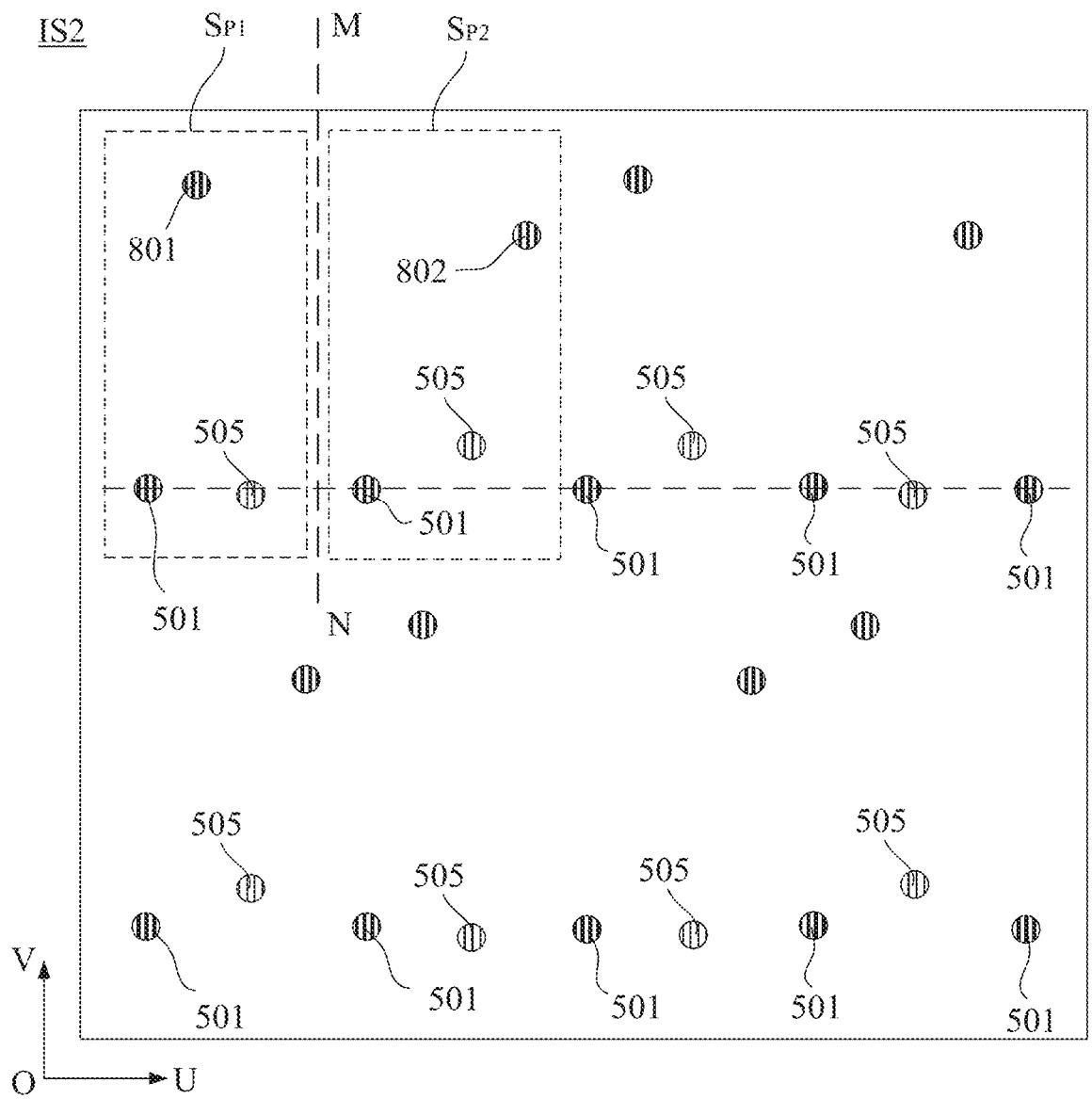
Figure 9A:
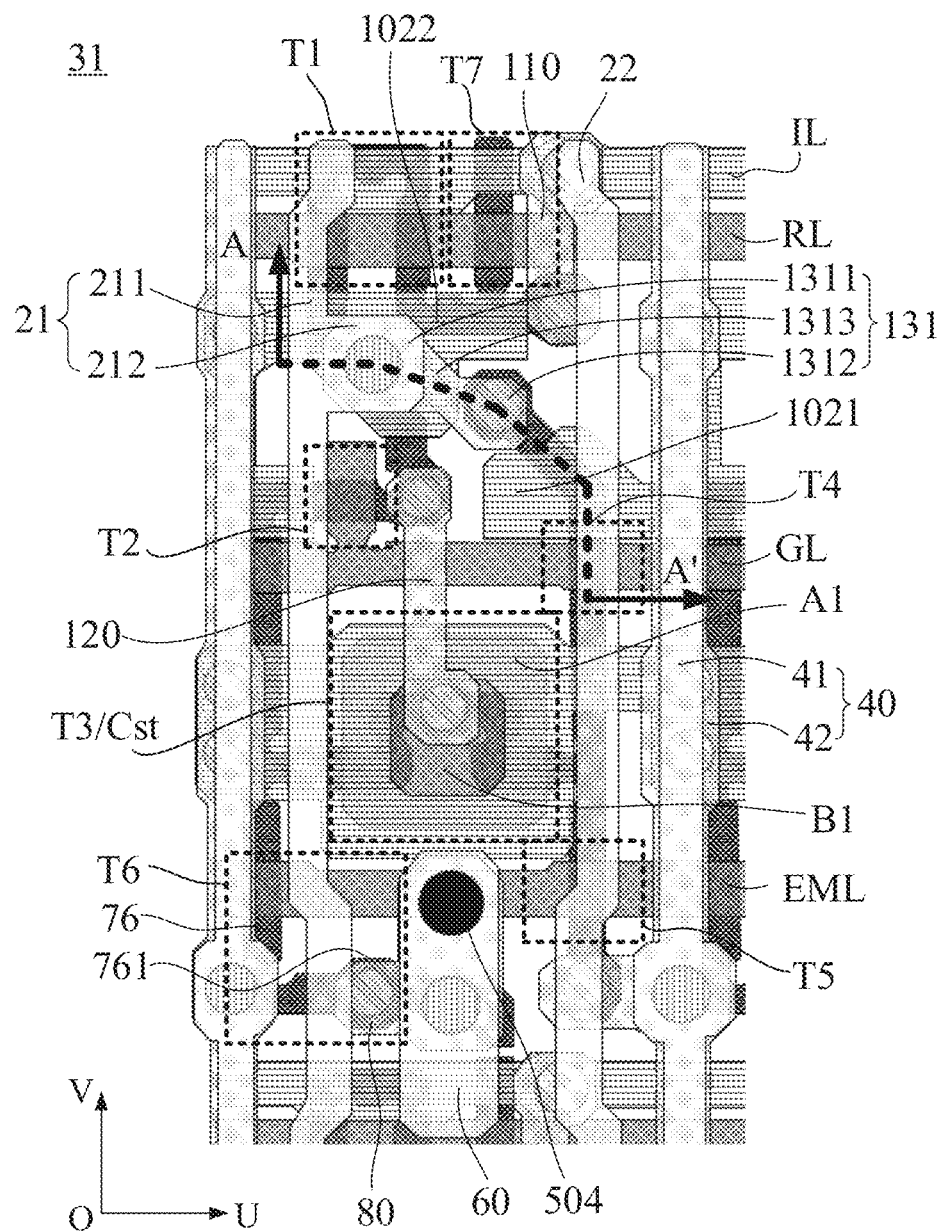
FIG. 9A is a schematic diagram showing a structure of a first sub-pixel, in accordance with some embodiments.
Figure 9B:
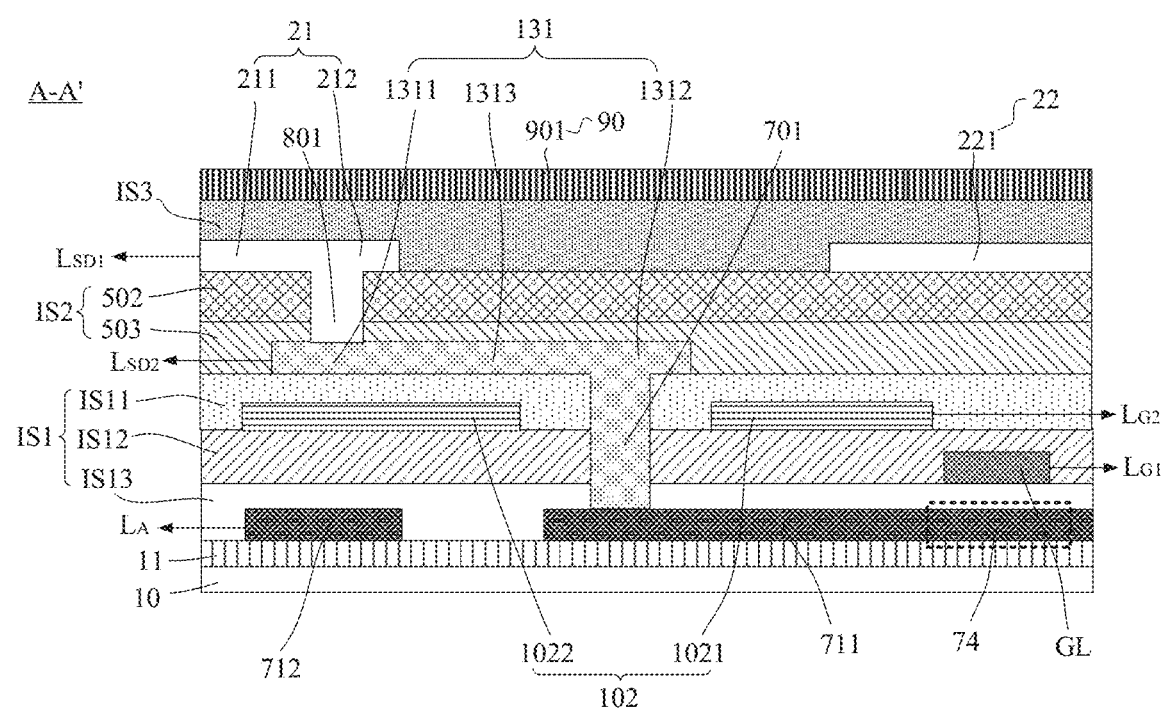
FIG. 9B is a schematic section view of the first sub-pixel in FIG. 9A taken along the dotted line AA'.
Figure 10A:
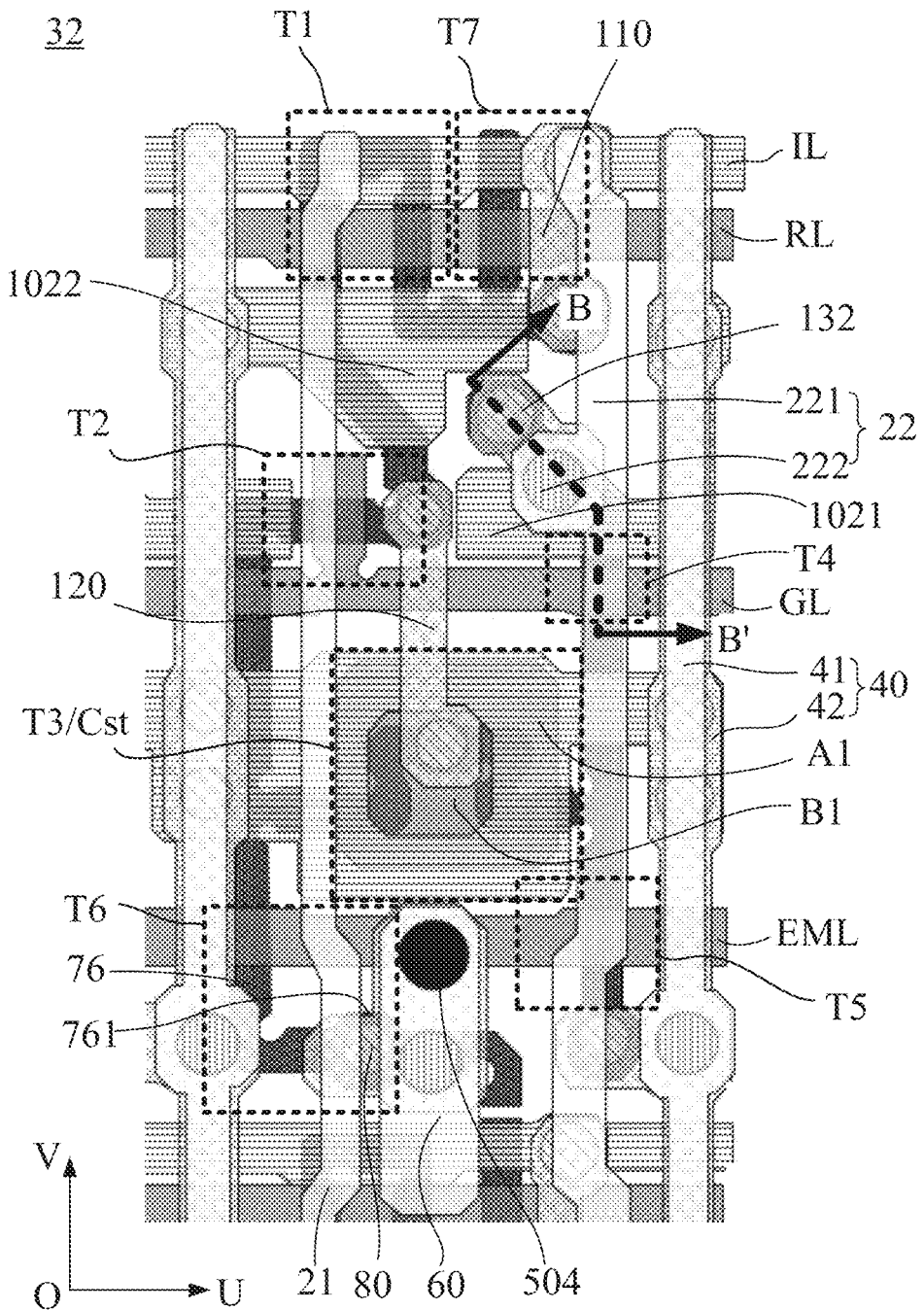
FIG. 10A is a schematic diagram showing a structure of a second sub-pixel, in accordance with some embodiments.
Figure 10B:
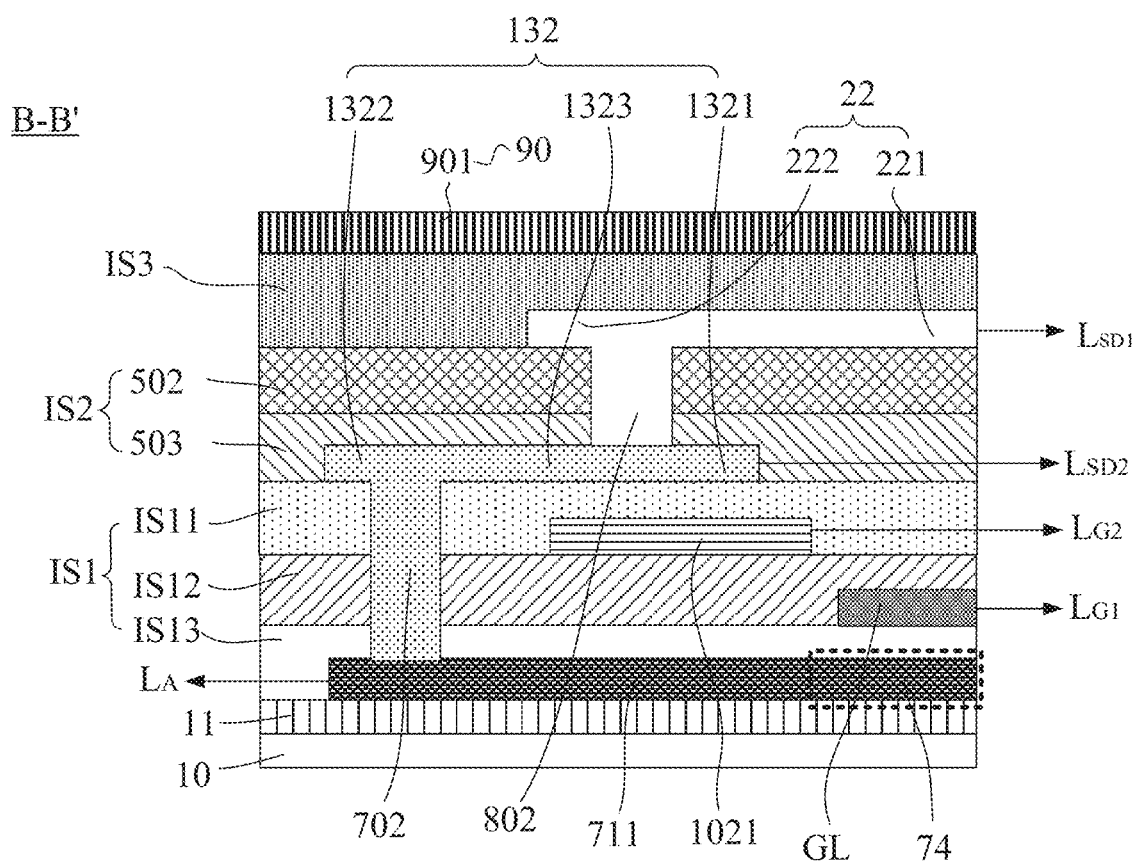
FIG. 10B is a schematic section view of the second sub-pixel in FIG. 10A taken along the dotted line BB'.

Structures of the elements in the pixel driving circuits of the sub-pixels in the display apparatus 1000 shown in FIG. 7 will be introduced below as shown in FIGS. 9B and 10B, in a thickness direction of the base 10, the display apparatus 1000 includes an active layer $L_A$, a first gate metal layer $L_{G1}$, a second gate metal layer $L_{G2}$, and a first source-drain metal layer $L_{SD1}$ that are sequentially disposed on the base 10. It will be noted that, a region $S_{P1}$ in FIGS. 8A to 8F is a region where one first sub-pixel 31 is located, and a region $S_{P2}$ is a region where one second sub-pixel 32 is located.

Figure 13A:
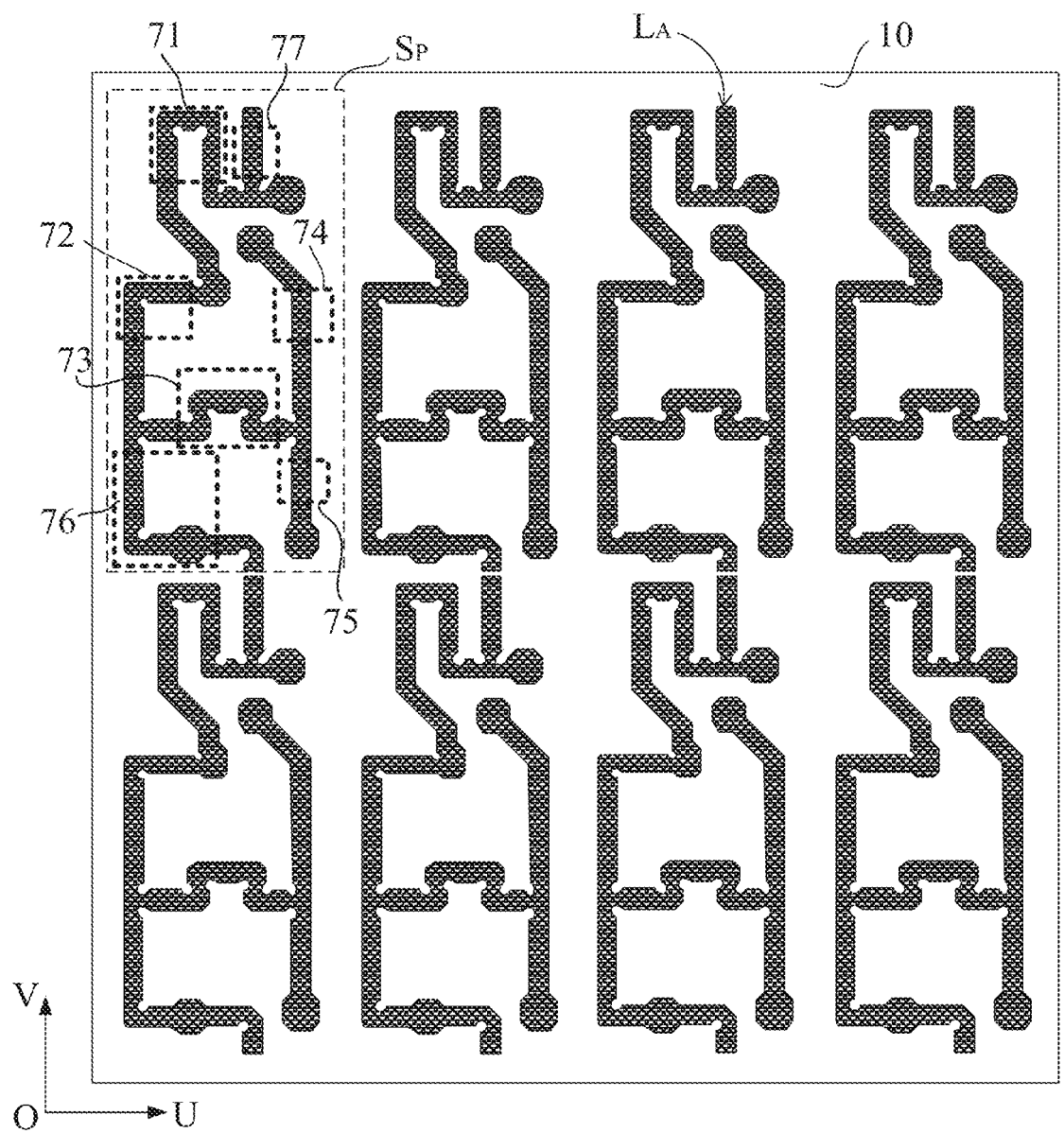
FIGS. 13A to 13F are schematic diagrams showing connection relationships between film layers of a display substrate, in accordance with some embodiments.

As shown in FIGS. 8A and 13A, the active layer $L_A$ includes an active pattern 71 of the first transistor T1, an active pattern 72 of the second transistor T2, an active pattern 73 of the third transistor T3, an active pattern 74 of the fourth transistor T4, an active pattern 75 of the fifth transistor T5, an active pattern 76 of the sixth transistor T6, and an active pattern 77 of the seventh transistor T7.

Figure 13B:
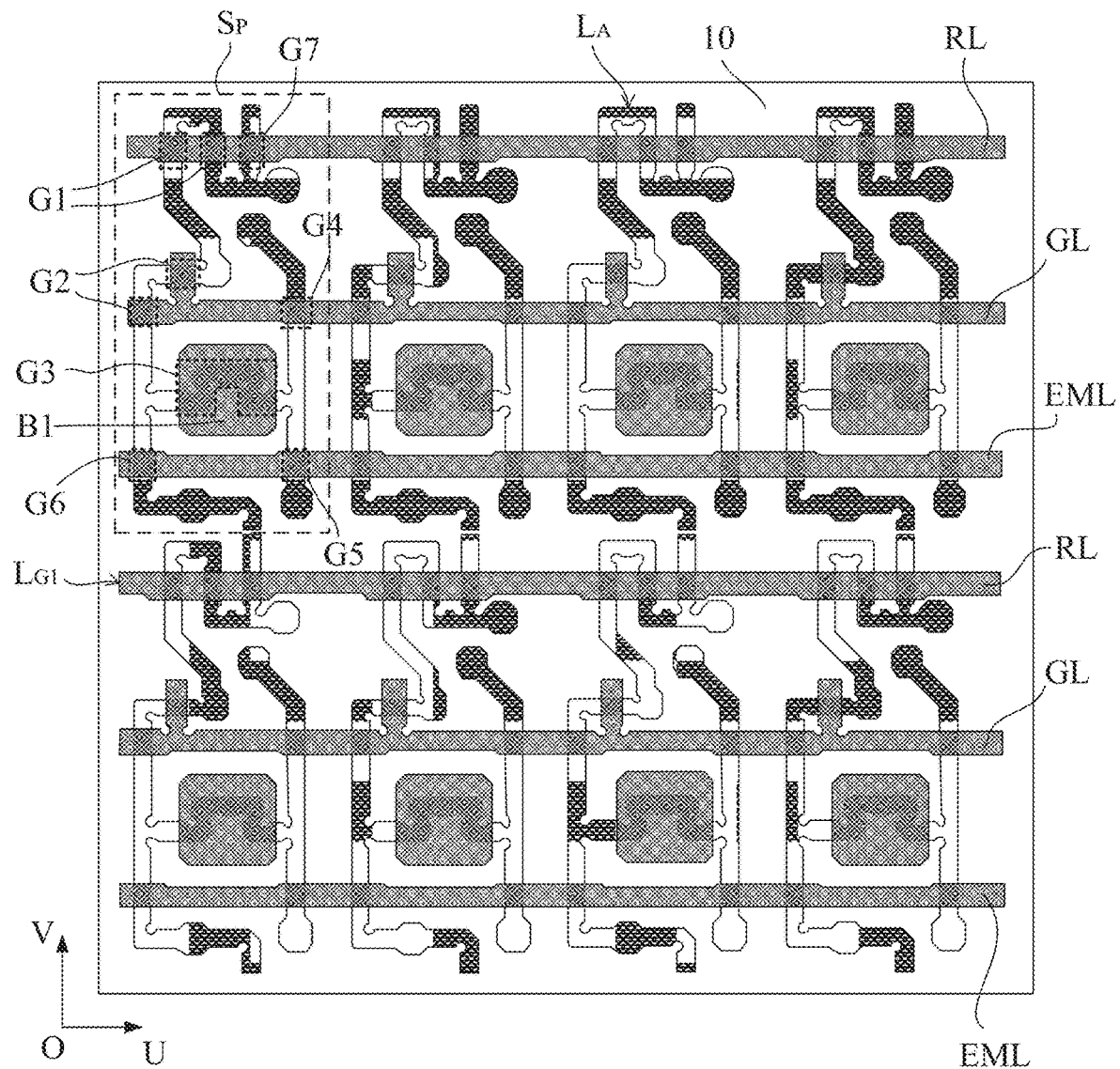

As shown in FIGS. 8B and 13B, the first gate metal layer $L_{G1}$ includes the gate G1 of the first transistor T1, the gate G2 of the second transistor T2, the gate G3 of the third transistor T3, the gate G4 of the fourth transistor T4, the gate G5 of the fifth transistor T5, the gate G6 of the sixth transistor T6, and the gate G7 of the seventh transistor T7. The first gate metal layer $L_{G1}$ further includes the second electrode plate B1 of the capacitor Cst, reset signal lines RL, gate lines GL, and light-emitting signal lines EML. Here, the reset signal line RL is configured to transmit the reset signal Vre from the reset signal terminal RESET to corresponding sub-pixels. The gate line GL is configured to transmit the scan signal Vgate from the scan signal terminal GATE to corresponding sub-pixels. The light-emitting signal line EML is configured to transmit the light-emitting signal Vem from the light-emitting signal terminal EM to corresponding sub-pixels.

It will be noted that, referring to FIGS. 13A and 13B, a portion, whose orthogonal projection on the base 10 overlaps with an orthogonal projection of the active pattern 71 of the first transistor T1 on the base 10, of the first gate metal layer $L_{G1}$ may serve as the gate G1 of the first transistor T1. A portion, whose orthogonal projection on the base 10 overlaps with an orthogonal projection of the active pattern 72 of the second transistor T2 on the base 10, of the first gate metal layer $L_{G1}$ may serve as the gate G2 of the second transistor T2. A portion, whose orthogonal projection on the base 10 overlaps with an orthogonal projection of the active pattern 73 of the third transistor T3 on the base 10, of the first gate metal layer $L_{G1}$ may serve as the gate G3 of the third transistor T3. A portion, whose orthogonal projection on the base 10 overlaps with an orthogonal projection of the active pattern 74 of the fourth transistor T4 on the base 10, of the first gate metal layer $L_{G1}$ may serve as the gate G4 of the fourth transistor T4. A portion, whose orthogonal projection on the base 10 overlaps with an orthogonal projection of the active pattern 75 of the fifth transistor T5 on the base 10, of the first gate metal layer $L_{G1}$ may serve as the gate G5 of the fifth transistor T5. A portion, whose orthogonal projection on the base 10 overlaps with an orthogonal projection of the active pattern 76 of the sixth transistor T6 on the base 10, of the first gate metal layer $L_{G1}$ may serve as the gate G6 of the sixth transistor T6. A portion, whose orthogonal projection on the base 10 overlaps with an orthogonal projection of the active pattern 77 of the seventh transistor T7 on the base 10, of the first gate metal layer $L_{G1}$ may serve as the gate G7 of the seventh transistor T7.

Figure 13C:
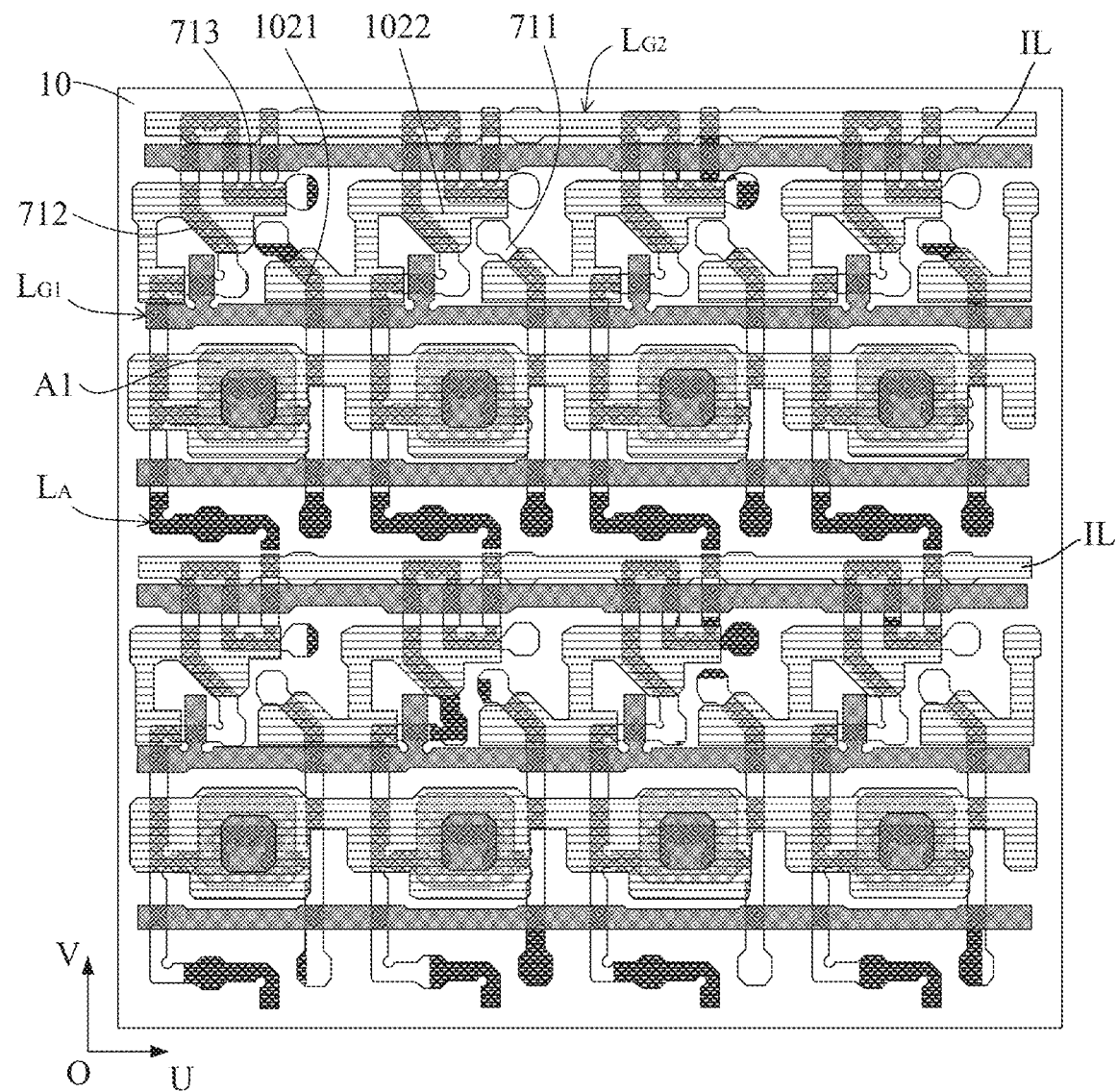

As shown in FIGS. 8C and 13C, the second gate metal layer $L_{G2}$ includes the first electrode plates A1 of the capacitors Cst and initialization voltage signal lines IL. The initialization voltage signal line is configured to transmit the initialization voltage signal Vin from the initialization voltage signal terminal INIT to corresponding sub-pixels.

Figure 8G:
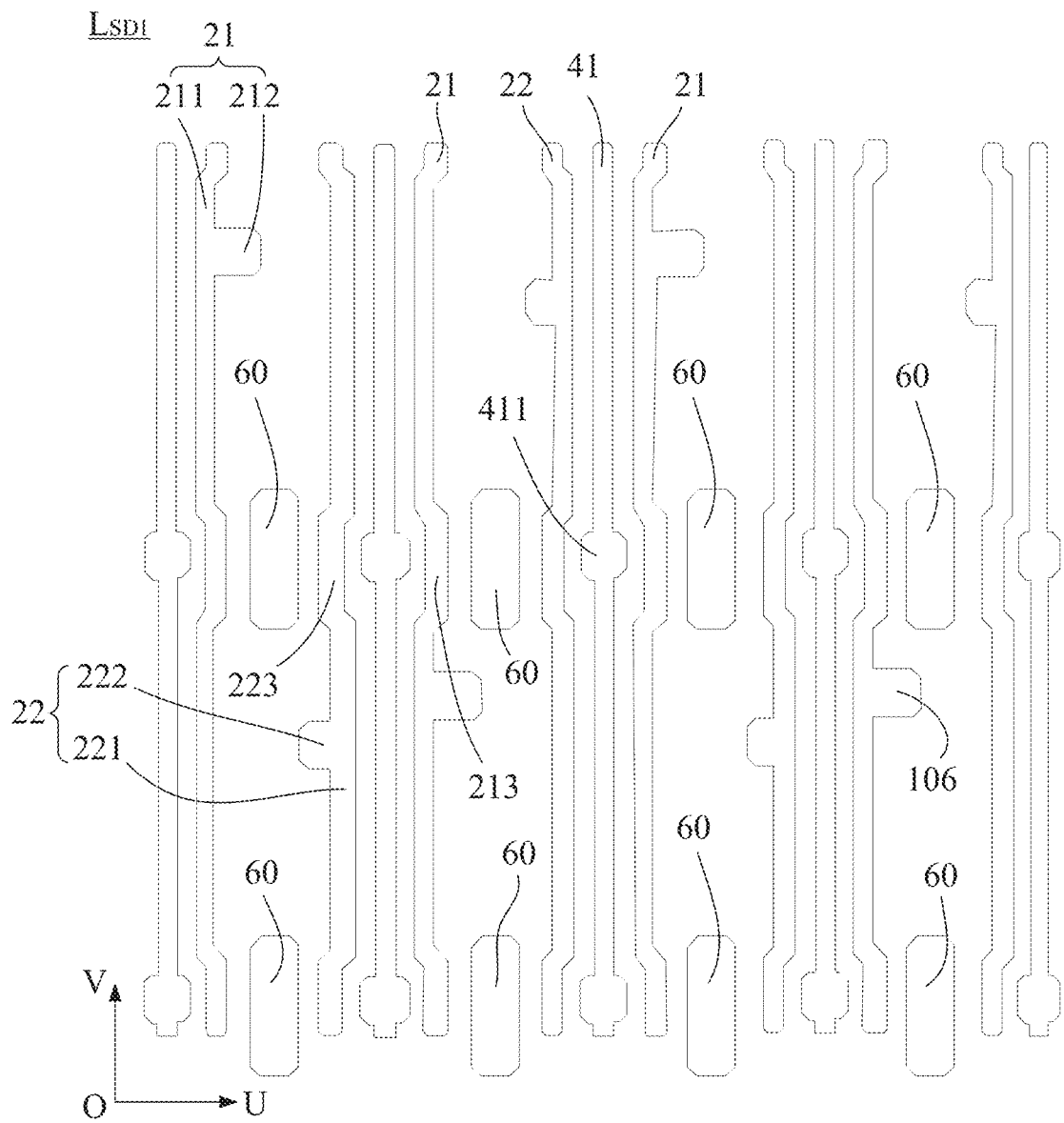
Figure 13D:
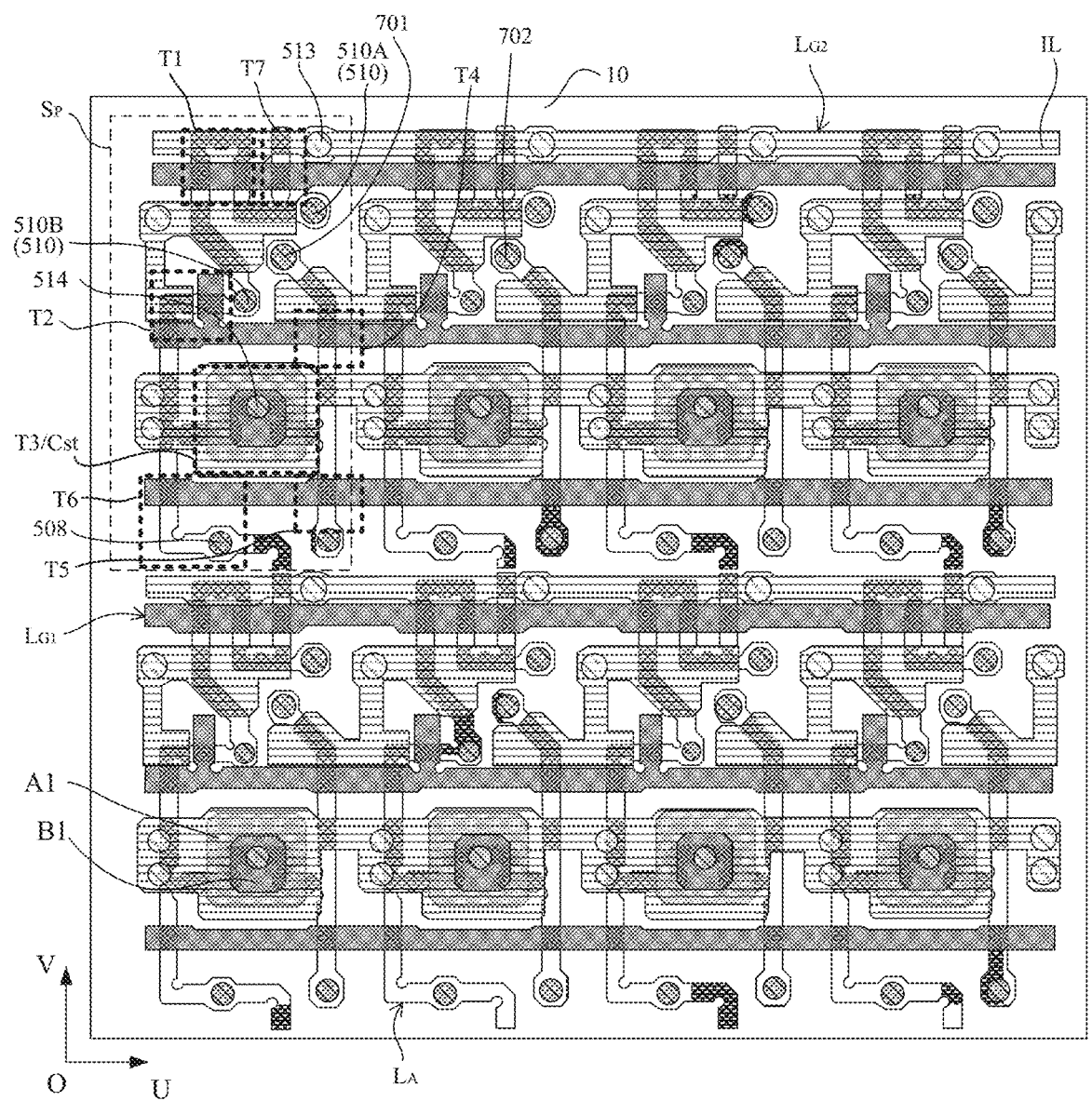
Figure 13E:
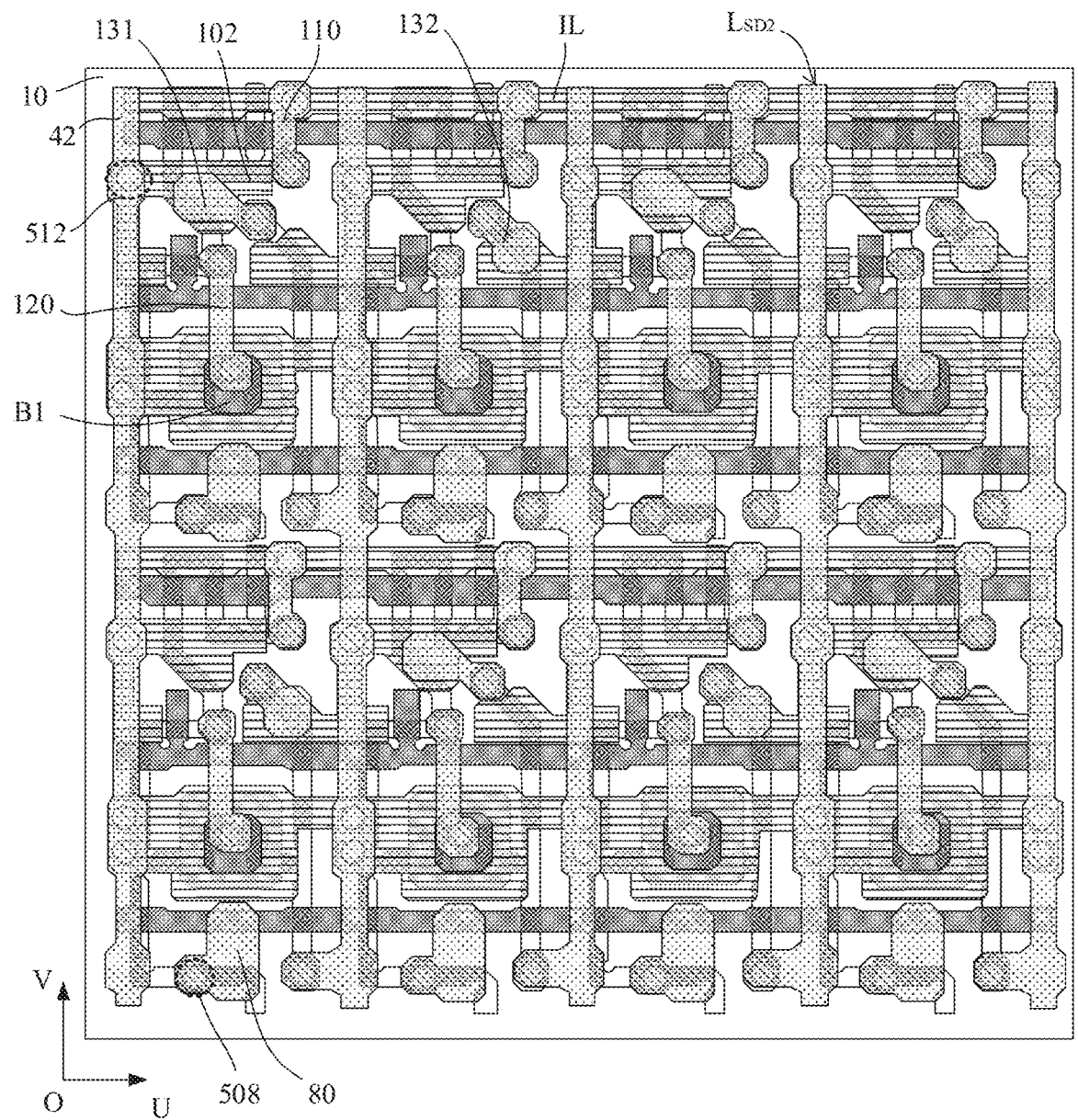
Figure 13F:
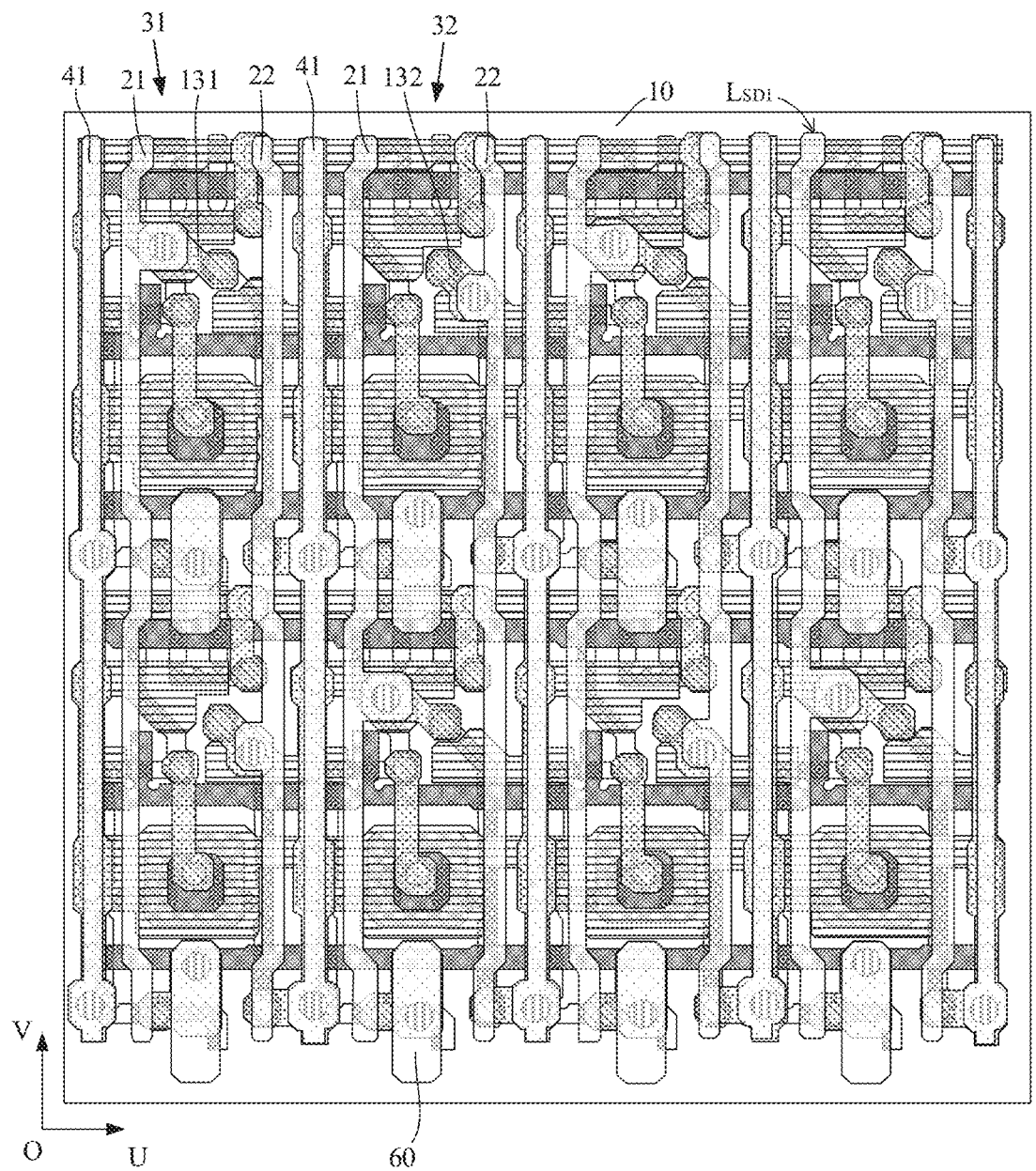

As shown in FIGS. 8G and 13F, the first source-drain metal layer $L_{SD1}$ includes a plurality of first data lines 21 and a plurality of second data lines 22. The first data lines 21 and the second data lines 22 are alternately arranged in the first direction OU, and every two adjacent columns of sub-pixels have a first data line and a second data line therebetween. In the first direction OU, a column of sub-pixels corresponds to a first data line 21 and a second data line 22 that are located at two sides thereof. Each first sub-pixel 31 in the column of sub-pixels is electrically connected to the corresponding first data line 21, and each second sub-pixel 32 in the column of sub-pixels is electrically connected to the corresponding second data line 22. It will be noted that, a sub-pixel being electrically connected to a corresponding data line means that a pixel driving circuit of the sub-pixel being electrically connected to the corresponding data line.

Referring to FIG. 11, connection relationships between the pixel driving circuits of the sub-pixels and signal lines in the display substrate 1000 will be exemplarily described below.

In a same column of sub-pixels, fourth transistors T4 in first sub-pixels 31 are electrically connected to the same first data line 21, and fourth transistors T4 in second sub-pixels 32 are electrically connected to the same second data line 22. That is, the first sub-pixels 31 receive data signals Vdata through the first data line 21, and the second sub-pixels 32 receive data signals Vdata through the second data line 22.

Gates of second transistors T2 and fourth transistors T4 in sub-pixels located in the same row are electrically connected to a scan signal terminal GATE in the same stage (e.g., a scan signal terminal $GATE_N$ in an N-th stage or a scan signal terminal $GATA_{N+1}$ in an (N+1)-th stage) through the same gate line GL.

Gates of fifth transistors T5 and sixth transistors T6 in the sub-pixels located in the same row are electrically connected to a light-emitting signal terminal EM in the same stage (e.g., a light-emitting signal terminal $EM_N$ in an N-th stage or a light-emitting signal terminal $EM_{N+1}$ in an (N+1)-th stage) through the same light-emitting signal line EML.

Gates of first transistors T1 and seventh transistors T7 in the sub-pixels located in the same row are electrically connected to a scan signal terminal GATE in a previous stage through the same reset signal line RL. It will be noted that, a scan signal Vgate output by the scan signal terminal GATE in the previous stage serves as the reset signal Vre. That is, the scan signal terminal GATE in the previous stage serves as the reset signal terminal RESET electrically connected to pixel driving circuit of the sub-pixels in the current row. For example, in FIG. 11, a scan signal Vgate output by the scan signal terminal $GATE_N$ in the N-th stage serves as a reset signal Vre for sub-pixels in which second transistors T2 and fourth transistors T4 are electrically connected to a scan signal terminal $GATE_{N+1}$ in the (N+1)-th stage.

First electrodes of the first transistors T1 and the seventh transistors T7 in the sub-pixels located in the same row are electrically connected to the initialization voltage signal terminal INIT through the same initialization voltage signal line IL. Here, the initialization voltage signal Vin output by the initialization voltage signal terminal INIT may be a constant voltage signal. For example, the initialization voltage signal Vin may be a constant low voltage signal.

In some embodiments, referring to FIGS. 8E, 9A to 10B and 13E, the display substrate 1000 further includes a second source-drain metal layer $L_{SD2}$ disposed between the base 10 and the first source-drain metal layer $L_{SD1}$. For example, in a case where the display substrate 1000 includes the second gate metal layer $L_{G2}$, the second source-drain metal layer $L_{SD2}$ is disposed between the second gate metal layer $L_{G2}$ and the first source-drain metal layer $L_{SD1}$.

As shown in FIG. 8E, the second source-drain metal layer $L_{SD2}$ includes a plurality of first connection portions 131 and a plurality of second connection portions 132. Here, a first connection portion 131 is disposed in the first region $S_{P1}$ where the first sub-pixel 31 is located, and a second connection portion 132 is disposed in the second region $S_{P2}$ where the second sub-pixel 32 is located. Referring to FIGS. 9A and 9B, each first sub-pixel 31 is electrically connected to a corresponding first data line 21 through a first connection portion 131. A first end 1311 of each first connection portion 131 is electrically connected to a corresponding first data line 21, and a second end 1312 of the first connection portion 131 is electrically connected to a pixel driving circuit of a corresponding first sub-pixel 31, for example, electrically connected to an active pattern 74 of a fourth transistor T4 of the pixel driving circuit of the first sub-pixel 31. Referring to FIGS. 10A and 10B, each second sub-pixel 32 is electrically connected to a corresponding second data line 22 through a second connection portion 132. A first end 1321 of each second connection portion 132 is electrically connected to a corresponding second data line 22, and a second end 1322 of the second connection portion 132 is electrically connected to a pixel driving circuit of a corresponding second sub-pixel 32, for example, electrically connected to an active pattern 74 of a fourth transistor T4 of the pixel driving circuit of the second sub-pixel 32. Referring to in FIGS. 7 and 8E, in the same column of sub-pixels, an extending direction of a first line CD connecting the second end 1312 of the first connection portion 131 and the second end 1322 of the second connection portion 132 is substantially parallel to the second direction OV. The first end 1311 of the first connection portion 131 is located at a first side of the first line CD. The first side may be, for example, a side of the first line CD proximate to the first data line 21 corresponding to the column of sub-pixels in the first direction OU. The first end 1321 of the second connection portion 132 is located at a second side of the first line CD. The second side may be, for example, a side of the first line CD proximate to the second data line 22 corresponding to the column of sub-pixels in the first direction OU.

As shown in FIG. 9B, for the first sub-pixel 31, the first connection portion 131 is located in the second source-drain metal layer $L_{SD2}$, and the second data line 22 corresponding to the first sub-pixel 31 is located in the first source-drain metal layer $L_{SD1}$. Therefore, the first connection portion 131 and the second data line 22 are located in different layers. In this way, even if a distance between orthogonal projections of the second end 1312 of the first connection portion 131 and the second data line 22 on the base 10 is small, a parasitic capacitance generated between the first connection portion 131 and the second data line 22 is small because they are located in different layers. An orthogonal projection of the first end 1311 of the first connection portion 131 on the base 10 is far away from the orthogonal projection of the second data line 22 on the base 10, and thus a portion, electrically connected to the first end 1311 of the first connection portion 131, of the first data line 21 corresponding to the first sub-pixel 31 is far away from the second data line 22, so that there is no large parasitic capacitance between the first end 1311 of the first connection portion 131 as well as the portion of first data line 21 and the second data line 22.

Similarly, for the second sub-pixel 32, the second connection portion 132 is located in the second source-drain metal layer $L_{SD2}$, and the first data line 21 corresponding to the second sub-pixel 32 is located in the first source-drain metal layer $L_{SD1}$. Therefore, the second connection portion 132 and the first data line 21 are located in different layers. In this way, even if a distance between orthogonal projections of the second end 1322 of the second connection portion 132 and the first data line 21 on the base 10 is small, a parasitic capacitance generated between the second connection portion 132 and the first data line 21 is small because they are located in different layers. An orthogonal projection of the first end 1321 of the second connection portion 132 on the base 10 is far away from the orthogonal projection of the first data line 21 on the base 10, and thus a portion, electrically connected to the first end 1321 of the second connection portion 132, of the second data line 22 corresponding to the second sub-pixel 32 is far away from the first data line 21, so that there is no large parasitic capacitance between the first end 1321 of the second connection portion 132 as well as the portion of the second data line 22 and the first data line 21.

In this way, in the display substrate 1000, for a certain sub-pixel, a parasitic capacitance between a data line that is not electrically connected to the pixel driving circuit of the sub-pixel and the pixel driving circuit of the sub-pixel may be reduced. Therefore, the influence of the parasitic capacitance on the light emission of the sub-pixel may be reduced, so that the display effect of the display apparatus may be improved.

For example, referring to FIGS. 9B and 10B, in a case where the display substrate 1000 includes the active layer $L_A$ disposed between the base 10 and the second source-drain metal layer $L_{SD2}$, the display substrate 1000 further includes an inorganic buffer layer 11 disposed between the base 10 and the active layer $L_A$. The inorganic buffer layer 11 may be of a single-layer structure or a multi-layer laminated structure, e.g., a laminated structure in which inorganic film layers and organic film layer(s) are alternately arranged.

In some embodiments, referring to FIGS. 7 and 8A, in a case where each sub-pixel includes the fourth transistor T4 (which may also be referred to as the writing transistor), active patterns 74 (for convenience of description, the active patterns will be referred to as fourth active patterns 74 below) of fourth transistors T4 in every two adjacent sub-pixels in the first direction OU have a substantially same distance therebetween, and fourth active patterns 74 of fourth transistors T4 in every two adjacent sub-pixels in the second direction OV have a substantially same distance therebetween. That is, a position of each fourth active pattern 74 in a region $S_P$ where a corresponding sub-pixel is located is substantially the same. As shown in FIGS. 9B and 10B, in each first sub-pixel 31, the second end 1312 of the first connection portion 131 is electrically connected to the fourth active pattern 74 of a corresponding fourth transistor T4. In each second sub-pixel 32, the second end 1322 of the second connection portion 132 is electrically connected to the fourth active pattern 74 of a corresponding fourth transistor T4.

For example, referring to FIGS. 9A to 10B, in the second direction OV, in each first sub-pixel 31, compared with an orthogonal projection of the first end 1311 of the first connection portion 131 on the active layer $L_A$, an orthogonal projection of the second end 1312 of the first connection portion 131 on the active layer $L_A$ is closer to the corresponding fourth active pattern 74; and in each second sub-pixel 32, compared with an orthogonal projection of the second end 1322 of the second connection portion 132 on the active layer $L_A$, an orthogonal projection of the first end 1321 of the second connection portion 132 on the active layer $L_A$ is closer to the corresponding fourth active pattern 74.

In some embodiments, referring to FIG. 8E, the second source-drain metal layer $L_{SD2}$ further includes a plurality of third connection portions 110 and a plurality of fourth connection portions 120. Referring to FIGS. 8A, 9A and 10A, in each sub-pixel, the active pattern 71 of the first transistor T1 and the active pattern 77 of the seventh transistor T7 are electrically connected to the initialization voltage signal line IL through a corresponding third connection portion 110, thereby achieving electrical connections of the first transistor T1 and the seventh transistor T7 to the initialization voltage signal line IL. In each sub-pixel, the active pattern 71 of the first transistor T1, the active pattern 72 of the second transistor T2 and the active pattern 73 of the third transistor T3 are electrically connected through a corresponding fourth connection portion 120.

In some embodiments, referring to FIG. 7, each row of sub-pixels includes a plurality of first sub-pixels 31 and a plurality of second sub-pixels 32, and the first sub-pixels 31 and the second sub-pixels 32 are alternately arranged in the first direction OU.

Referring to FIGS. 7, 8A and 8E, in the same row of sub-pixels, an extension direction of a second line EF connecting the second end 1312 of the first connection portion 131 and the second end 1322 of the second connection portion 132 is substantially parallel to the first direction OU. The first end 1311 of the first connection portion 131 is located at a side of the second line EF away from a fourth active pattern 74 in the same sub-pixel as the first connection portion 131 in the second direction. The first end 1321 of the second connection portion 132 is located at a side of the second connecting line EF proximate to a fourth active pattern 74 in the same sub-pixel as the second connection portion 132 in the second direction.

In this way, in the first sub-pixel 31, a distance between the first connection portion 131 and the fourth connection portion 120 may be increased, so that a risk of a short circuit of the pixel driving circuit of the first sub-pixel 31 may be reduced. In the second sub-pixel 32, a distance between the second connection portion 132 and the third connection portion 110 may be increased, so that a risk of a short circuit of the pixel driving circuit of the second sub-pixel 32 may be reduced.

In some embodiments, referring to FIGS. 8D and 9A to 10B, the display substrate 1000 further includes a first insulating layer IS1 disposed between the second source-drain metal layer $L_{SD2}$ and the active layer $L_A$. The first insulating layer IS1 is provided with a plurality of first via holes 701 and a plurality of second via holes 702 therein. In each first sub-pixel 31, the second end 1312 of the first connection portion 131 is electrically connected to the fourth active pattern 74 of the corresponding fourth transistor T4 through a corresponding first via hole 701. In each second sub-pixel 32, the second end 1322 of the second connection portion 132 is electrically connected to the fourth active pattern 74 of the corresponding fourth transistor T4 through a corresponding second via hole 702.

For example, referring to FIGS. 9A to 10B, the first insulating layer IS1 includes a first insulating sub-layer IS11 and a second insulating sub-layer IS12 and the second insulating sub-layer IS12 is disposed on a side of the first insulating sub-layer IS11 proximate to the base 10.

Referring to FIGS. 8A, 9A to 10B, the active layer $L_A$ further includes a plurality of first active connection portions 711, a plurality of second active connection portions 712, and a plurality of third active connection portions 713. In each first sub-pixel 31, the fourth active pattern 74 of the fourth transistor T4 is electrically connected to the second end 1312 of the first connection portion 131 through a corresponding first active connection portion 711. In each second sub-pixel 32, the fourth active pattern 74 of the fourth transistor T4 is electrically connected to the second end 1322 of the second connection portion 132 through a corresponding first active connection portion 711. In each sub-pixel, the active pattern 71 (for convenience of description, the active pattern will be referred to as a first active pattern below) of the first transistor T1 (which may also be referred to as the first reset transistor) and the active pattern 72 (for convenience of description, the active pattern will be referred to as a second active pattern 72 below) of the second transistor T2 (which may also be referred to as the compensation transistor) are electrically connected through a corresponding second active connection portion 712, and a corresponding third active connection portion 713 is connected between the first active pattern 71 of the first transistor T1 and the active pattern 77 (for convenience of description, the active pattern will be referred to as a seventh active pattern 77 below) of the seventh transistor T7.

In a case where the display substrate 1000 includes the second gate metal layer $L_{G2}$, the second gate metal layer $L_{G2}$ is disposed between the first insulating sub-layer IS11 and the second insulating sub-layer IS12. Referring to FIGS. 8C and 13C, the second gate metal layer $L_{G2}$ further includes a plurality of first shielding portions 1021 and a plurality of second shielding portions 1022. Each sub-pixel is provided with a first shielding portion 1021 and a second shielding portion 1022 therein. Referring to FIGS. 8A, 8C and 13C, in each sub-pixel, an orthogonal projection of the first shielding portion 1021 on the base 10 overlaps with an orthogonal projection of a corresponding first active connection portion 711 on the base 10, an orthogonal projection of the second shielding portion 1022 on the base 10 overlaps with an orthogonal projection of a corresponding third active connection portion 713 on the base 10, and the orthogonal projection of the second shielding portion 1022 on the base 10 overlaps with an orthogonal projection of a corresponding second active connection portion 712 on the base 10.

Here, when the display apparatus including the display substrate 1000 displays an image, the second shielding portion 1022 may shield the corresponding second active connection portion 712 and the corresponding third active connection portion 713 from light, thereby reducing leakage currents of the first transistor T1, the second transistor T2, and the seventh transistor T7; and the first shielding portion 1021 may shield the corresponding first active connection portion 711 from light, thereby reducing a leakage current of the fourth transistor T4.

Based on this, as shown in FIGS. 9A and 9B, in each first sub-pixel 31, an orthogonal projection of the first connection portion 131 on the base 10 overlaps with the orthogonal projection of the second shielding portion 1022 on the base 10, the orthogonal projection of the first connection portion 131 on the base 10 is non-overlapping with the orthogonal projection of the first shielding portion 1021 on the base 10, and an orthogonal projection of the second end 1312 of the first connection portion 131 on the base 10 is non-overlapping with the orthogonal projection of the second shielding portion 1022 on the base 10. As shown in FIGS. 10A and 10B, in each second sub-pixel 32, an orthogonal projection of the second connection portion 132 on the base 10 overlaps with the orthogonal projection of the first shielding portion 1021 on the base 10, the orthogonal projection of the second connection portion 132 on the base 10 is non-overlapping with the orthogonal projection of the second shielding portion 1022 on the base 10, and the orthogonal projection of the second end 1322 of the second connection portion 132 on the base 10 is non-overlapping with the orthogonal projection of the first shielding portion 1021 on the base 10.

In this way, in the first sub-pixel 31, the first shielding portion 1021 and the second shielding portion 1022 may avoid the first via hole 701 disposed in the first insulating layer IS1, thereby preventing the first shielding portion 1021 and the second shielding portion 1022 from affecting the electrical connection between the first connection portion 131 and the corresponding fourth active pattern 74. In the second sub-pixel 32, the first shielding portion 1021 and the second shielding portion 1022 may avoid the second via hole 702 disposed in the first insulating layer IS1, thereby preventing the first shielding portion 1021 and the second shielding portion 1022 from affecting the electrical connection between the second connection portion 132 and the corresponding fourth active pattern 74.

Here, the first shielding portion 1021 and the second shielding portion 1022 may be made of the same material and formed through the same patterning process, so that the manufacturing process may be simplified.

For example, as shown in FIG. 8C, in the same row of sub-pixels, the first shielding portions 1021 and the second shielding portions 1022 are alternately arranged in the first direction OU, and the first shielding portion 1021 and the second shielding portion 1022 that are adjacent in the first direction OU and located in different sub-pixels are formed into a one-piece structure.

In some embodiments, referring to FIGS. 9B and 10B, the first insulating layer IS1 further includes a third insulating sub-layer IS13 disposed on a side of the second insulating sub-layer IS12 proximate to the base 10. In this case, the first gate metal layer $L_{G1}$ is disposed between the second insulating sub-layer IS12 and the third insulating sub-layer IS13.

For example, referring to FIGS. 8D and 13D, the first insulating layer IS1 is further provided with seventh via holes 510 (e.g., including seventh via holes 510A and 510B) therein, the first insulating sub-layer IS11 is provided with eighth via holes 513 therein, and the first insulating sub-layer IS11 and the second insulating sub-layer IS12 are provided with ninth via holes 514 penetrating therethrough (that is, the ninth via holes 514 penetrates through the first insulating sub-layer IS11 and the second insulating sub-layer IS12). An end of the third connection portion 110 is electrically connected to the seventh active pattern 77 of the seventh transistor T7 through a seventh via hole 510A, and the other end of the third connection portion 110 is electrically connected to the initialization voltage signal line IL through an eighth via hole 513. An end of the fourth connection portion 120 is electrically connected to the first active pattern 71 of the first transistor T1 and the second active pattern 72 of the second transistor T2 through a seventh via hole 510B, and the other end of the fourth connection portion 120 is electrically connected to the active pattern 73 (for convenience of description, the active pattern is referred to as a third active pattern here) of the third transistor T3 (which may also be referred to as the driving transistor) through a ninth via hole 514.

In some embodiments, referring to FIG. 8E, a maximum dimension of each first connection portion 131 in an extending direction of the first connection portion 131 is greater than a maximum dimension of each second connection portion 132 in an extending direction of the second connection portion 132.

In some embodiments, referring to FIG. 8E, an area of the first end 1311 of each first connection portion 131 is greater than an area of the second end 1312 thereof; in some other embodiments, referring to FIG. 8E, an area of the first end 1321 of each second connection portion 132 is greater than an area of the second end 1322 thereof. As a result, it may facilitate an electrical connection between the first connection portion 131 and the corresponding first data line 21, and facilitate an electrical connection between the second connection portion 132 and the corresponding second data line 22.

In some embodiments, as shown in FIGS. 8E, 9A and 9B, each first connection portion 131 further includes a first transition sub-portion 1313. The first transition sub-portion 1313 is connected between the first end 1311 and the second end 1312 of the first connection portion 131. A dimension of the first transition sub-portion 1313 in a direction perpendicular to the extending direction of the first connection portion 131 is less than dimensions of the first end 1311 and the second end 1312 of the first connection portion 131 in the direction perpendicular to the extending direction of the first connection portion 131.

For example, as shown in FIGS. 8E, 10A and 10B, each second connection portion 132 further includes a second transition sub-portion 1323. The second transition sub-portion 1323 is connected between the first end 1321 and the second end 1322 of the second connection portion 132. A dimension of the second transition sub-portion 1323 in a direction perpendicular to the extending direction of the second connection portion 132 is less than dimensions of the first end 1321 and the second end 1322 of the second connection portion 132 in the direction perpendicular to the extending direction of the first connection portion 132.

In some embodiments, referring to FIGS. 7, 8G and 9A to 10B, each first data line 21 includes a first body 211 and a plurality of fifth connection portions 212. The plurality of fifth connection portions 212 are disposed at a side of the first body 211 proximate to first sub-pixels 31 that are electrically connected to the first data line 21 and arranged in the second direction OV. Each fifth connection portion 212 is electrically connected between the first body 211 and a first end 1311 of a corresponding first connection portion 131.

Each second data line 22 includes a second body 221 and a plurality of sixth connection portions 222. The plurality of sixth connection portions 222 are disposed at a side of the second body 221 proximate to second sub-pixels 32 that are electrically connected to the second data line 22 and arranged in the second direction OV. Each sixth connection portion 222 is electrically connected between the second body 221 and a first end 1321 of a corresponding second connection portion 132.

Here, the first data line 21 is electrically connected to corresponding first connection portions 131 through the plurality of fifth connection portions 212, which may increase an electrical contact area between the first data line 21 and the first connection portion 131, and thereby facilitate the electrical connection between the two. Similarly, the second data line 22 is electrically connected to corresponding second connection portions 132 through the plurality of sixth connection portions 222, which may increase an electrical contact area between the second data line 22 and the second connection portion 132, and thereby facilitate the electrical connection between the two.

For example, referring to FIGS. 8F, 9A to 10B, the display substrate 1000 further includes a second insulating layer IS2 disposed between the first source-drain metal layer LSD1 and the second source-drain metal layer LSD2. The second insulating layer IS2 is provided with a plurality of third via holes 801 and a plurality of fourth via holes 802 therein. Each fifth connection portion 212 is electrically connected to the first end 1311 of the corresponding first connection portion 131 through a corresponding third via hole 801. Each sixth connection portion 222 is electrically connected to the first end 1321 of the corresponding second connection portion 132 through a corresponding fourth via hole 802.

In some embodiments, referring to FIG. 7, the display substrate 1000 further includes a plurality of first voltage signal lines 40 disposed on the base 10. An orthogonal projection, on the base 10, of each first voltage signal line 40 is located between orthogonal projections, on the base 10, of the first data line 21 and the second data line 22 between two adjacent columns of sub-pixels. Each first voltage signal line 40 is electrically connected to pixel driving circuits of at least one column of sub-pixels of the two adjacent columns of sub-pixels.

First electrodes of fifth transistors T5 of sub-pixels in a same column may be electrically connected to the first voltage signal terminal VDD through the same first voltage signal line 40. Here, the first voltage signal line 40 may be used to transmit a first voltage signal Vdd from the first voltage signal terminal VDD to the sub-pixels electrically connected thereto.

For example, referring to FIGS. 8E, 8G, 9A, 10A and 12, each first voltage signal line 40 includes a first voltage signal sub-line 41 disposed in the first source-drain metal layer $L_{SD1}$ and a second voltage signal sub-line 42 disposed in the second source-drain metal layer $L_{SD2}$. The first voltage signal sub-line 41 is electrically connected to the second voltage signal sub-line 42. For example, as shown in FIG. 8F, the second insulating layer IS2 is provided with a plurality of fifth via holes 501 therein. The first voltage signal sub-line 41 is electrically connected to the second voltage signal sub-line 42 through at least one of the plurality of fifth via holes 501.

It will be noted that, the first voltage signal line 40 may transmit the first voltage signal Vdd with a constant voltage to the sub-pixels electrically connected thereto. That is, the voltage of the first voltage signal sub-line 41 and the second voltage signal sub-line 42 may be both a stable voltage. When the display apparatus including the display substrate 1000 displays an image, since the first voltage signal sub-line 41, disposed in the same layer as the first data line 21 and the second data line 22 and located between the first data line 21 and the second data line 22, has the stable voltage thereon, it may shield the data signals Vdata transmitted on the first data line 21 and the second data line 22. In this way, in a display process of the display apparatus, a parasitic capacitance between the first data line 21 and the adjacent second data line 22 may be reduced due to the first voltage signal sub-line 41 disposed between the first data line 21 and the second data line 22, so that a crosstalk between the data signals Vdata may be reduced, and the display effect of the display apparatus may be improved.

For example, the first voltage signal sub-line 41, the first data line 21, and the second data line 22 may be formed through the same patterning process, so that they are disposed in the same layer.

For example, orthogonal projections of the first voltage signal sub-line 41 on the base 10 overlap with or partially overlap with the second voltage signal sub-line 42 on the base 10. In this way, the fifth via hole(s) 501 may be disposed in a region where the orthogonal projections of the two overlap, thereby facilitating the connection between the two through the fifth via hole(s) 501.

Figure 12:
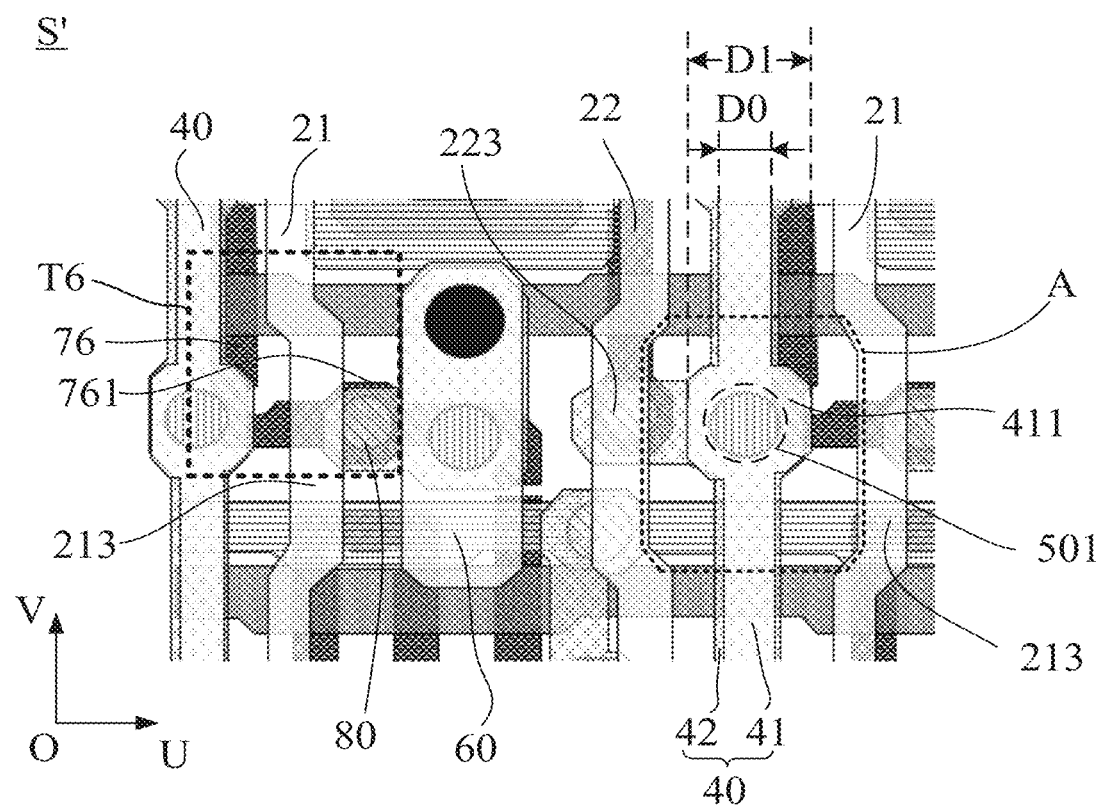
FIG. 12 is a partial enlarged view of a portion of the display substrate shown in the region S' in FIG. 7.

Based on this, in some embodiments, referring to FIG. 12, in the first data line 21, the second data line 22 and the first voltage signal sub-line 41 that are located between two adjacent columns of sub-pixels, a portion of the first data line 21 adjacent to the fifth via hole(s) 501 is bent in a direction from the first voltage signal sub-line 41 to the first data line 21 to form a first bent portion 213, and a portion of the second data line 22 adjacent to the fifth via hole(s) 501 is bent in a direction from the first voltage signal sub-line 41 to the second data line 22 to form a second bent portion 223. The first bent portion 213 and the second bent portion 223 are opposite to each other to form an accommodating region A. As shown in FIGS. 8G and 12, the first voltage signal sub-line 41 includes a conductive portion 411 passing through the fifth via hole(s) 501, and the conductive portion 411 is located in the accommodating region A.

Here, a dimension D1 of the conductive portion 411 may be greater than a width D0 of a portion of the first voltage signal sub-line 41 except the conductive portion 411 in the first direction OU. In this way, the fifth via hole 501 may have a large dimension in the first direction OU, thereby ensuring good electrical contact between the first voltage signal sub-line 41 and the second voltage signal sub-line 42.

In some embodiments, as shown in FIGS. 8G and 12, in the first data line 21 and the second data line 22 that are adjacent to the column of sub-pixels and located at two sides of the column of sub-pixels in the first direction OU, a first bent portion 213 and a second bent portion 223 are disposed opposite to each other. The display substrate 1000 further includes seventh connection portions 60 disposed in the first source-drain metal layer LSD1 and a seventh connection portion 60 is disposed between the first bent portion 213 and the second bent portion 223 that are disposed opposite to each other. The seventh connection portion 60 is configured to shield the data signals Vdata on the first data line 21 and the second data line 22 that are adjacent to the column of sub-pixels and located at two sides of the column of sub-pixels in the first direction OU. An orthogonal projection of the seventh connection portion 60 on the base 10 may have a regular shape or an irregular shape.

For example, as shown in FIGS. 9B and 10B, the display substrate 1000 further includes an anode layer 90 disposed at a side of the first source-drain metal layer LSD1 away from the base 10. The anode layer 90 includes an anode pattern 901 provided in each sub-pixel. Referring to FIGS. 9A, 10A and 12, in a case where the pixel driving circuit of each sub-pixel includes the sixth transistor T6 (which may also be referred to as the first light-emitting control transistor), the active pattern 76 (for convenience of description, the active pattern will be referred to as a sixth active pattern 76 below) of the sixth transistor T6 includes a first conductor portion 761. The seventh connection portion 60 is electrically connected to the first conductor portion 716 of the corresponding sixth active pattern 76 and the corresponding anode pattern.

For example, the display substrate 1000 further includes a light-emitting device E disposed in each sub-pixel. The light-emitting device E includes the anode pattern, a cathode pattern and a light-emitting functional layer disposed between the anode pattern and the cathode pattern.

Referring to FIG. 11, the cathode pattern of the light-emitting device E may be electrically connected to the second voltage signal terminal VSS. For example, in a case where the display substrate 1000 further includes second voltage signal lines, the cathode pattern of the light-emitting device E may be electrically connected to the second voltage signal terminal VSS through a second voltage signal line, so as to receive a second voltage signal Vss from the second voltage signal terminal VSS.

The light-emitting functional layer includes a light-emitting material layer. In addition, the light-emitting functional layer may further include at least one of an electron transport layer (ETL), an electron injection layer (EIL), a hole transport layer (HTL), or a hole injection layer (HIL). The light-emitting material layer may be an organic light-emitting material layer. In this case, the display apparatus including the display substrate 1000 is an organic light-emitting diode (OLED) display apparatus. The light-emitting material layer may also be a quantum dot light-emitting material layer. In this case, the display apparatus including the display substrate 1000 is a quantum dot light-emitting diode (QLED) display apparatus.

Here, the sixth active pattern 76 of the sixth transistor T6 may include the first conductor portion 761, a channel portion, and a second conductor portion. The first conductor portion 761 and the second conductor portion are connected through the channel portion. The first conductor portion may serve as one of the source and the drain of the sixth transistor T6, and the second conductor portion may serve as the other of the source and the drain of the sixth transistor T6. For example, referring to FIG. 11, in a case where the sixth transistor T6 is the P-type transistor, the first conductor portion 761 connected to the anode pattern 901 serves as the drain of the sixth transistor T6, and the second conductor portion serves as the source of the sixth transistor T6.

In the display substrate 1000, the seventh connection portion 60 is electrically connected to the light-emitting device E, and the light-emitting device E is electrically connected to the second voltage signal terminal VSS. As a result, in the process of displaying an image by the display apparatus including the display substrate 1000, the seventh connection portion 60 may shield the data signals Vdata on the first data line 21 and the second signal line 22 located between two columns of sub-pixels due to the stable voltage on the seventh connection portion 60, so that the crosstalk between the data signals Vdata is reduced, and the display effect of the display apparatus is improved.

It will also be noted that, in the display substrate 1000, since the seventh connection portion 60 is disposed in the same layer as the first voltage signal sub-line 41, the first data line 21 and the second data line 22, it may be possible to form the seventh connection portion 60 that may be used to reduce the crosstalk between the data signals Vdata on the first data line 21 and the second data line 22 without adding additional patterning processes.

Figure 8H:
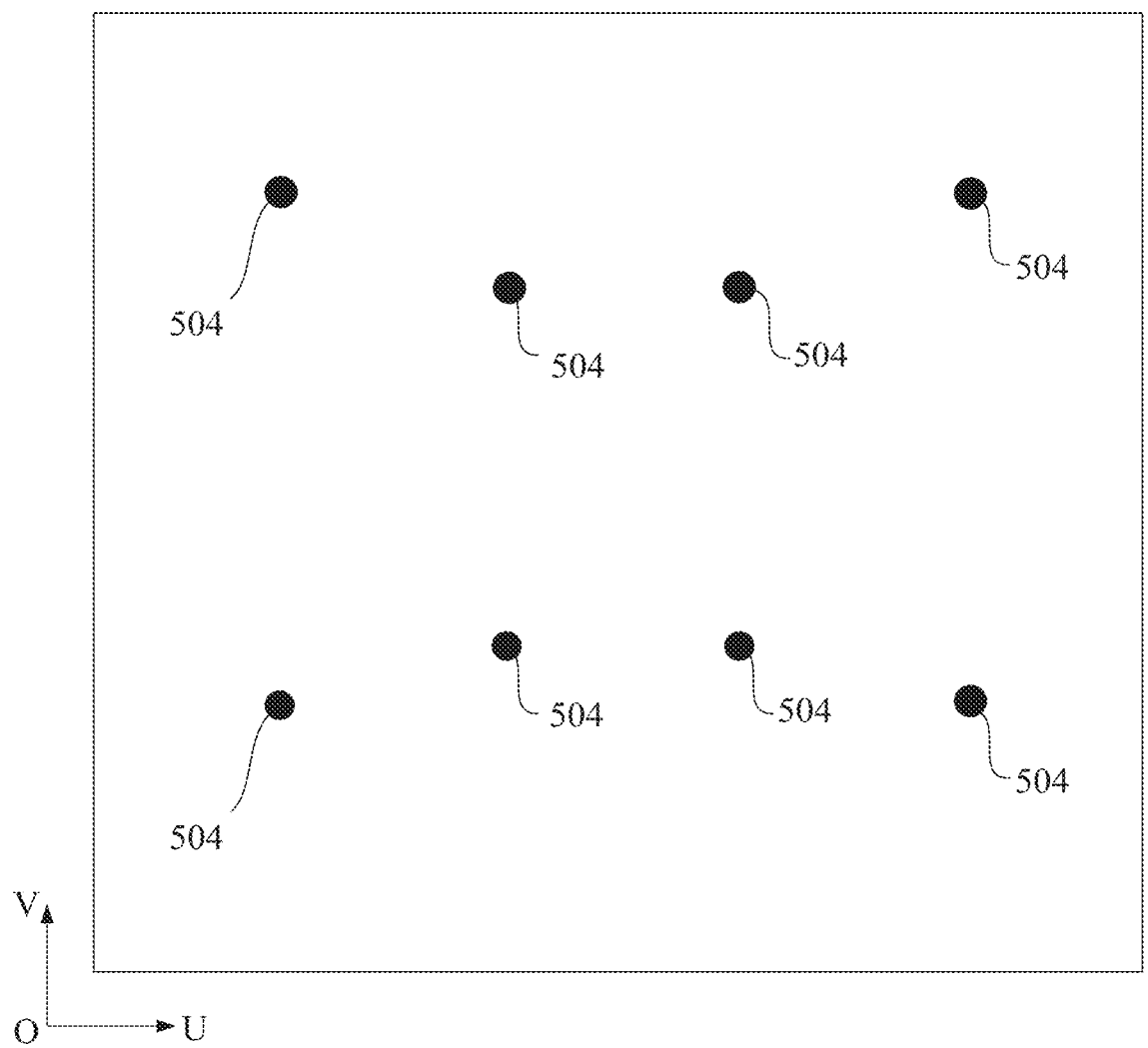

For example, referring to FIGS. 8H, 9B and 10B, the display substrate 1000 further includes a third insulating layer IS3 disposed on a side of the first source-drain metal layer $L_{SD1}$ away from the base 10. The third insulating layer IS3 is provided with tenth via holes 504 therein. The seventh connection portion 60 is electrically connected to the anode pattern 901 of the light-emitting device E through a tenth via hole 504.

In some embodiments, referring to FIGS. 8D to 8F, 9A, 10A, 13E and 13F, the display substrate 1000 further includes eighth connection portions 80 disposed in the second source-drain metal layer $L_{SD2}$. Each sub-pixel is provided with an eighth connection portion 80 therein. The first insulating layer IS1 is further provided with eleventh via holes 508 therein, and the second insulating layer IS2 is further provided with twelfth via holes 505 therein, An end of the eighth connection portion 80 is electrically connected to the sixth active pattern 76 of the sixth transistor T6 through an eleventh via hole 508, and the other end of the eighth connection portion 80 is electrically connected to the seventh connection portion 60 through a twelfth via hole 505, so as to achieve an electrical connection between the sixth active pattern 76 of the sixth transistor T6 and the anode pattern 901 of the light-emitting device E.

Some embodiments of the present disclosure provide a display apparatus including the display substrate 1000. Beneficial effects of the display apparatus are the same as those of the display substrate 1000, which will not be repeated herein.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display substrate having a plurality of sub-pixels arranged in an array in a first direction and a second direction, each column of sub-pixels including first sub-pixels and second sub-pixels, the first sub-pixels and the second sub-pixels being alternately arranged in the second direction; the display substrate comprising:
 a base;
 a first source-drain metal layer disposed on the base, the first source-drain metal layer including a plurality of first data lines and a plurality of second data lines, wherein
  the first data lines and the second data lines are alternately arranged in the first direction, every two adjacent columns of sub-pixels being provided with a first data line and a second data line therebetween; and
  a column of sub-pixels corresponds to a first data line and a second data line that are located at two sides of the column of sub-pixels in the first direction, each first sub-pixel in the column of sub-pixels is electrically connected to the corresponding first data line, and each second sub-pixel in the column of sub-pixels is electrically connected to the corresponding second data line;
 a second source-drain metal layer disposed between the base and the first source-drain metal layer, wherein the second source-drain metal layer includes:
  a plurality of first connection portions, wherein each first connection portion includes a first end and a second end, a pixel driving circuit of each first sub-pixel is electrically connected to a second end of a first connection portion, and a first end of the first connection portion is electrically connected to a corresponding first data line; and
  a plurality of second connection portions, wherein each second connection portion includes a first end and a second end, a pixel driving circuit of each second sub-pixel is electrically connected to a second end of a second connection portion, and a first end of the second connection portion is electrically connected to a corresponding second data line, wherein
   in a same column of sub-pixels, an extension direction of a first line connecting a second end of a first connection portion in a first sub-pixel and a second end of a second connection portion in a second sub-pixel is substantially parallel to the second direction, a first end of the first connection portion in the first sub-pixel is located at a first side of the first line, and a first end of the second connection in the second sub-pixel portion is located at a second side of the first line.

2. The display substrate according to claim 1, further comprising an active layer disposed between the base and the second source-drain metal layer, wherein
 the pixel driving circuit of each of the first sub-pixels and the sub-pixels includes a writing transistor, the writing transistor includes an active pattern disposed in the active layer; active patterns of writing transistors in every two adjacent sub-pixels in the first direction have a substantially same distance therebetween, and active patterns of writing transistors of every two adjacent sub-pixels in the second direction have a substantially same distance therebetween; and
 in each first sub-pixel, the second end of the first connection portion is electrically connected to an active pattern of a corresponding writing transistor; and in each second sub-pixel, the second end of the second connection portion is electrically connected to an active pattern of a corresponding writing transistor.

3. The display substrate according to claim 2, wherein first sub-pixels and second sub-pixels in each row are alternately arranged in the first direction; and
 in a same row of sub-pixels, an extension direction of a second line connecting a second end of a first connection portion in a first sub-pixel and a second end of a second connection portion in a second sub-pixel is substantially parallel to the first direction, a first end of the first connection portion in the first sub pixel is located at a side of the second line away from an active pattern of a writing transistor in the same first sub-pixel as the first connection portion in the second direction, and a first end of the second connection portion in the second sub-pixel is located at a side of the second line proximate to an active pattern of a writing transistor in the same second sub-pixel as the second connection portion in the second direction.

4. The display substrate according to claim 2, further comprising a first insulating layer disposed between the second source-drain metal layer and the active layer, the first insulating layer being provided with a plurality of first via holes and a plurality of second via holes therein, wherein
 in each first sub-pixel, the second end of the first connection portion is electrically connected to the active pattern of the corresponding writing transistor through a corresponding first via hole, and in each second sub-pixel, the second end of the second connection portion is electrically connected to the active pattern of the corresponding writing transistor through a corresponding second via hole.

5. The display substrate according to claim 4, wherein the first insulating layer includes a first insulating sub-layer and a second insulating sub-layer, the second insulating sub-layer is disposed between the first insulating sub-layer and the base; and
 the display substrate further comprises a second gate metal layer disposed between the first insulating sub-layer and the second insulating sub-layer, the second gate metal layer includes a plurality of first shielding portions and a plurality of second shielding portions, and each sub-pixel is provided with a first shielding portion and a second shielding portion therein, wherein in each first sub-pixel, an orthogonal projection of the first connection portion on the base overlaps with an orthogonal projection of the second shielding portion on the base, the orthogonal projection of the first connection portion on the base is non-overlapping with an orthogonal projection of the first shielding portion on the base, and an orthogonal projection of the second end of the first connection portion on the base is non-overlapping with the orthogonal projection of the second shielding portion on the base; in each second sub-pixel, an orthogonal projection of the second connection portion on the base overlaps with an orthogonal projection of the first shielding portion on the base, the orthogonal projection of the second connection portion on the base is non-overlapping with an orthogonal projection of the second shielding portion on the base, and an orthogonal projection of the second end of the second connection portion on the base is non-overlapping with the orthogonal projection of the first shielding portion.

6. The display substrate according to claim 5, wherein in a same row of sub-pixels, first shielding portions and second shielding portions are alternately arranged in the first direction, the first shielding portion and the second shielding portion that are adjacent in the first direction and located in different sub-pixels are formed into a one-piece structure.

7. The display substrate according to claim 1, wherein a maximum dimension of each first connection portion in an extending direction of the first connection portion is greater than a maximum dimension of each second connection portion in an extending direction of the second connection portion.

8. The display substrate according to claim 1, wherein an area of the first end of each first connection portion is greater than an area of the second end thereof, and/or an area of the first end of each second connection portion is greater than an area of the second end thereof.

9. The display substrate according to claim 1, wherein each first data line includes a first body and a plurality of fifth connection portions, the plurality of fifth connection portions are disposed at a side of the first body proximate to first sub-pixels that are electrically connected to the first data line and arranged in the second direction; each fifth connection portion is electrically connected between the first body and a first end of a corresponding first connection portion; and each second data line includes a second body and a plurality of sixth connection portions, the plurality of sixth connection portions are disposed at a side of the second body proximate to second sub-pixels that are electrically connected to the second data line and arranged in the second direction; each sixth connection portion is electrically connected between the second body and a first end of a corresponding second connection portion.

10. The display substrate according to claim 9, further comprising a second insulating layer disposed between the first source-drain metal layer and the second source-drain metal layer, the second insulating layer being provided with a plurality of third via holes and a plurality of fourth via holes therein, wherein each fifth connection portion is electrically connected to the first end of the corresponding first connection portion through a corresponding third via hole, and each sixth connection portion is electrically connected to the first end of the corresponding second connection portion through a corresponding fourth via hole.

11. The display substrate according to claim 1, further comprising a plurality of first voltage signal lines, wherein an orthogonal projection, on the base, of each first voltage signal line is located between orthogonal projections, on the base, of the first data line and the second data line between two adjacent columns of sub-pixels, and the first voltage signal line is electrically connected to pixel driving circuits of at least one column of sub-pixels of the two adjacent columns of sub-pixels; and the first voltage signal line includes a first voltage signal sub-line disposed in the first source-drain metal layer and a second voltage signal sub-line disposed in the second source-drain metal layer, and the first voltage signal sub-line is electrically connected to the second voltage signal sub-line.

12. The display substrate according to claim 11, further comprising a second insulating layer disposed between the first source-drain metal layer and the second source-drain metal layer, wherein the second insulating layer is provided with a plurality of fifth via holes therein; and the first voltage signal sub-line and the second voltage signal sub-line are electrically connected through at least one fifth via hole of the plurality of fifth via holes, wherein in a first data line, a second data line and a first voltage signal sub-line that are located between two adjacent columns of sub-pixels, a portion of the first data line adjacent to the fifth via hole is bent in a direction from the first voltage signal sub-line to the first data line to form a first bent portion;

a portion of the second data line adjacent to the fifth via hole is bent in a direction from the first voltage signal sub-line to the second data line to form a second bent portion; and the first bent portion and the second bent portion are opposite to each other to form an accommodating region; and the first voltage signal sub-line includes a conductive portion passing through the fifth via hole, the conductive portion is located in the accommodating region, a dimension of the conductive portion is greater than a width of a portion of the first voltage signal sub-line except the conductive portion in the first direction.

13. The display substrate according to claim 12, wherein a seventh connection portion is provided between a first bent portion and a second bent portion in the first data line and the second data line that are corresponding to the column of sub-pixels and located at two sides of the column of sub-pixels in the first direction, the seventh connection portion and the first voltage signal sub-line are disposed in a same layer.

14. The display substrate according to claim 13, further comprising an anode layer disposed at a side of the first source-drain metal layer away from the base, and an active layer disposed between the base and the second source-drain metal layer, the anode layer including an anode pattern provided in each sub-pixel, wherein the pixel driving circuit of each of the first sub-pixels and the second sub-pixel includes a first light-emitting control transistor, the first light-emitting control transistor includes an active pattern disposed in the active layer, the active pattern includes a first conductor portion; and the seventh connection portion is electrically connected to the first conductor portion and the anode pattern.

15. The display substrate according to claim 1, wherein the first side of the first line is a side of the first line proximate to the first data line corresponding to the column of sub-pixels in the first direction, and the second side of the first line is a side of the first line proximate to the second data line corresponding to the column of sub-pixels in the first direction.

16. A display apparatus comprising the display substrate according to claim 1.

17. The display substrate according to claim 1, wherein each first connection portion further includes a first transition sub-portion connected between the first end and the second end; in each first connection portion, a dimension of the first transition sub-portion in a direction perpendicular to an extending direction of the first connection portion is less than dimensions of the first end and the second end in the direction perpendicular to the extending direction of the first connection portion; and/or each second connection portion further includes a second transition sub-portion connected between the first end and the second end; in each second connection portion a dimension of the second transition sub-portion in a direction perpendicular to an extending direction of the second connection portion is less than dimensions of the first end and the second end in the direction perpendicular to the extending direction of the first connection portion.

18. The display substrate according to claim 14, further comprising eighth connection portions disposed in the second source-drain metal layer, each sub-pixel being provided with an eighth connection portion therein, wherein in a same sub-pixel, an end of the eighth connection portion is electrically connected to a first conductor portion of an active pattern, and another end of the eighth connection portion is electrically connected to a seventh connection portion.

* * * * *